United States Patent
Ashida et al.

(10) Patent No.: US 10,916,283 B2
(45) Date of Patent: Feb. 9, 2021

(54) MAGNETIC DOMAIN WALL MOVEMENT ELEMENT AND MAGNETIC RECORDING ARRAY

(71) Applicant: TDK CORPORATION, Tokyo (JP)

(72) Inventors: Takuya Ashida, Tokyo (JP); Tomoyuki Sasaki, Tokyo (JP); Tatsuo Shibata, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/795,876

(22) Filed: Feb. 20, 2020

(65) Prior Publication Data

US 2020/0273511 A1 Aug. 27, 2020

(30) Foreign Application Priority Data

Feb. 22, 2019 (JP) .................................. 2019-030434
Jan. 29, 2020 (JP) .................................. 2020-012694

(51) Int. Cl.
*G11C 11/00* (2006.01)
*G11C 11/16* (2006.01)
(Continued)

(52) U.S. Cl.
CPC ............ *G11C 11/161* (2013.01); *G11C 11/15* (2013.01); *G11C 11/1673* (2013.01); *G11C 11/1675* (2013.01); *H01L 27/228* (2013.01)

(58) Field of Classification Search
CPC ... G11C 11/161; G11C 11/15; G11C 11/1673; G11C 11/1675; H01L 27/228
(Continued)

(56) References Cited

U.S. PATENT DOCUMENTS

2006/0227465 A1* 10/2006 Inokuchi ................ B82Y 25/00
360/324.1
2010/0188890 A1 7/2010 Fukami et al.
(Continued)

FOREIGN PATENT DOCUMENTS

JP 4834836 B2 12/2011
JP 5598697 B2 10/2014
(Continued)

OTHER PUBLICATIONS

Burr et al., "Neuromorphic computing using non-volatile memory," Advances in Physics: X, 2017, vol. 2, No. 1, pp. 89-124.
(Continued)

*Primary Examiner* — Huan Hoang
(74) *Attorney, Agent, or Firm* — Oliff PLC

(57) ABSTRACT

A magnetic domain wall movement element includes a first ferromagnetic layer, a magnetic recording layer, a nonmagnetic layer, a first electrode, and a second electrode. The magnetic recording layer includes: a first region which overlaps with the first electrode and the first ferromagnetic layer in a first direction; a second region which overlaps with the second electrode and the first ferromagnetic layer in the first direction; and a third region which is located between the first region and the second region. An area of a first section in the first region facing the first electrode is larger than an area of a second section in the second region facing the second electrode. The first ferromagnetic layer overlaps with a part of the first electrode and a part of the second electrode in the first direction.

20 Claims, 13 Drawing Sheets

(51) Int. Cl.
*G11C 11/15* (2006.01)
*H01L 27/22* (2006.01)

(58) Field of Classification Search
USPC .......................................................... 365/158
See application file for complete search history.

(56) References Cited

U.S. PATENT DOCUMENTS

2010/0193889 A1    8/2010   Nagahara et al.
2012/0211811 A1    8/2012   Nagahara et al.
2016/0284980 A1*   9/2016   Tonegawa ............... H01L 43/02

FOREIGN PATENT DOCUMENTS

JP      5686626 B2       3/2015
WO      2009/019949 A1   2/2009

OTHER PUBLICATIONS

Narayanan et al., "Toward on-chip acceleration of the backpropagation algorithm using nonvolatile memory," IBM J. Res. & Dev., Jul./Sep. 2017, vol. 61, No. 4/5, Paper 11, pp. 1-11.

\* cited by examiner

MAGNETIC DOMAIN WALL MOVEMENT ELEMENT AND MAGNETIC RECORDING ARRAY

BACKGROUND OF THE INVENTION

Field of the Invention

The present invention relates to a magnetic domain wall movement element and a magnetic recording array. Priority is claimed on Japanese Patent Application No. 2019-030434, filed on Feb. 22, 2019 and Japanese Patent Application No. 2020-012694, filed on Jan. 29, 2020, the contents of which are incorporated herein by reference.

Description of Related Art

Attention has been focused on next-generation non-volatile memories that will replace flash memories or the like for which the limit of miniaturization has been reached. For example, magnetoresistive random access memories (MRAMs), resistance random access memories (ReRAMs), phase change random access memories (PCRAMs), and the like are known as next-generation non-volatile memories.

In MRAMs, a change in resistance value caused due to change in magnetization direction is used for data recording. In order to increase the capacity of recording memories, the miniaturization of each of elements constituting a memory and increasing the number of recording bits per element constituting the memory are being researched.

Patent Document 1 describes a magnetoresistive element in which movement of a magnetic domain wall is used. The magnetoresistive element described in Patent Document 1 has information recorded in an analog manner in accordance with a position of a magnetic domain wall. In the magnetoresistive element described in Patent Document 1, a range in which a magnetic domain wall can move is controlled using a magnetization fixed section.

PATENT DOCUMENT

[Patent Document 1] Japanese Patent No. 5598697

SUMMARY OF THE INVENTION

A resistance value changes in accordance with a difference between relative angles of magnetizations of two ferromagnetic materials having a nonmagnetic layer disposed therebetween. A magnetic domain wall movement element stores data on the basis of the resistance value. In a magnetic domain wall movement element, in order to prevent a domain wall from disappearing, a magnetization fixed section is provided in the magnetic recording layer in which a magnetic domain wall moves in some cases. Furthermore, in order to increase a degree of integration of a plurality of magnetic domain wall movement elements, a reference layer serving as a reference for resistance change is laminated on one surface of the magnetic recording layer including the magnetization fixed section in some cases. The magnetization fixed section has a fixed direction of magnetization and a relative angle between a magnetization of the magnetization fixed section and a magnetization of the reference layer does not change. Therefore, the magnetization fixed section does not cause a change in resistance value of the magnetic domain wall movement element and a range of change in resistance decreases by an extent corresponding an overlap between a magnetization fixed layer and the reference layer when viewed in a plan view. If a range of change in resistance value increases, for example, it is possible to prevent data recorded by the magnetic domain wall movement element from varying due to noise.

The present invention was made in view of the above-described problems and provides a magnetic domain wall movement type magnetic recording element and a magnetic memory which have a wide range of change in resistance and are stable.

(1) A magnetic domain wall movement element according to a first aspect includes: a first ferromagnetic layer; a magnetic recording layer located in a first direction with respect to the first ferromagnetic layer and extending in a second direction; a nonmagnetic layer located between the first ferromagnetic layer and the magnetic recording layer; and a first electrode and a second electrode which are located on a side of the magnetic recording layer opposite to the nonmagnetic layer, and each of the first electrode and the second electrode being configured to overlap with a part of the magnetic recording layer in the first direction, wherein the first electrode includes a magnetic material whose magnetization is oriented in a direction different from a direction of magnetization of the first ferromagnetic layer, the magnetic recording layer includes: a first region which overlaps with the first electrode and the first ferromagnetic layer in the first direction; a second region which overlaps with the second electrode and the first ferromagnetic layer in the first direction; and a third region which is located between the first region and the second region, an area of a first section in the first region facing the first electrode is larger than an area of a second section in the second region facing the second electrode, and the first ferromagnetic layer overlaps with a part of the first electrode and a part of the second electrode in the first direction.

(2) In the magnetic domain wall movement element according to the aspect, the second electrode may include a magnetic material whose magnetization is oriented in the same direction as the direction of magnetization of the first ferromagnetic layer.

(3) The magnetic domain wall movement element according to the aspect further includes: a substrate, wherein the first ferromagnetic layer may be located closer to the substrate than the magnetic recording layer.

(4) The magnetic domain wall movement element according to the aspect further includes: an insulating layer configured to cover the third region of the magnetic recording layer.

(5) The magnetic domain wall movement element according to the aspect further includes: a substrate, wherein the first ferromagnetic layer may be located farther from the substrate than the magnetic recording layer.

(6) In the magnetic domain wall movement element according to the aspect, a lateral surface of the magnetic recording layer in the second direction may be inclined with respect to the first direction.

(7) In the magnetic domain wall movement element according to the aspect, the first electrode may have a first inclined section inclined with respect to the first direction.

(8) On a virtual cross-section passing through a center of the magnetic recording layer in the magnetic domain wall movement element according to the aspect in a third direction orthogonal to the first direction and the second direction and extending in the first direction and the second direction, the first electrode may have a first lateral surface and a second lateral surface located closer to the second electrode than the first lateral surface, and the first lateral surface may have a portion having an inclination angle larger than an inclination angle with respect to the first direction of the second lateral surface.

(9) On a virtual cross-section passing through a center of the magnetic recording layer in the magnetic domain wall movement element according to the aspect in the third direction orthogonal to the first direction and the second direction and extending in the first direction and the second direction, the first electrode may have a first lateral surface and a second lateral surface located closer to the second electrode than the first lateral surface, and the first lateral surface may have a portion in which an inclination thereof with respect to the first direction changes discontinuously.

(10) A magnetic recording array according to a second aspect may include: a plurality of the magnetic domain wall movement elements according to the aspect.

According to the magnetic domain wall movement element and the magnetic recording array according to the aspect, it is possible to increase a range of change in resistance.

DETAILED DESCRIPTION OF THE INVENTION

Figure 1:
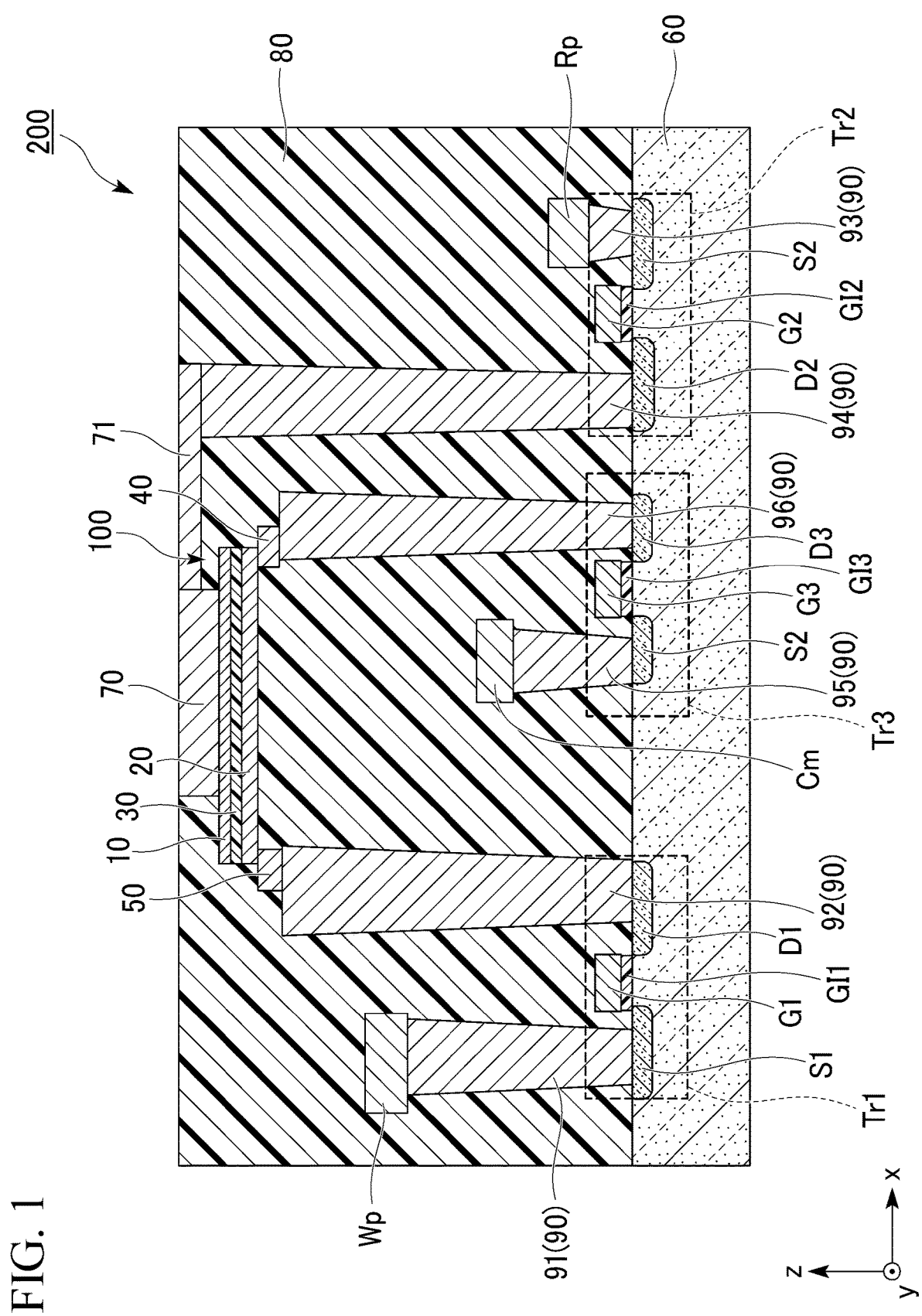
FIG. 1 is a cross-sectional view of a semiconductor device according to a first embodiment.

This embodiment will be described in detail below with reference to the drawings as appropriate. In the drawings used in the following description, in order to make the characteristics of the present invention easy to understand, for convenience, characteristic portions may be illustrated in an enlarged manner in some cases and dimensional ratios or the like of constituent elements may be different from actual dimensional ratios in some cases. The materials, dimensions, and the like exemplified in the following description are merely examples and the present invention is not limited thereto and it is possible to appropriately change and implement the present invention with a range in which the effects of the present invention can be obtained.

First, directions will be defined. An x direction and a y direction are directions substantially parallel to one surface of a substrate 60 which will be described later. The x direction is a direction in which a magnetic recording layer 20 which will be described later extends. The x direction is an example of a second direction. The y direction is a direction orthogonal to the x direction. A z direction is a direction orthogonal to the x direction and the y direction. The z direction is an example of a first direction. Furthermore, the expression "extends in the x direction" in the specification means that, for example, a dimension in the x direction is larger than a minimum dimension among dimensions in the x direction, the y direction, and the z direction. The same applies to the case of extending in other directions.

First Embodiment

<Semiconductor Device>

FIG. 1 is a cross-sectional view of a semiconductor device according to a first embodiment. FIG. 1 is a cross section taken along an xz plane passing through a center of a width of a magnetic recording layer 20 in the y direction. A semiconductor device 200 includes a plurality of storage elements 100 and semiconductor elements (for example, transistors) connected to the storage elements 100. FIG. 1 illustrates three transistors connected to the storage elements 100, focusing on one of the storage elements 100 for convenience. The semiconductor device 200 includes a first ferromagnetic layer 10, the magnetic recording layer 20, a nonmagnetic layer 30, a first electrode 40, a second electrode 50, the substrate 60, a third electrode 70, a plurality of insulating layers 80, a plurality of conductive sections 90, a first wiring Cm, a second wiring Wp, a third wiring Rp, a plurality of gate electrodes G1, G2, and G3, and a plurality of gate insulating films GI1, GI2, and GI3. The first ferromagnetic layer 10, the magnetic recording layer 20, the nonmagnetic layer 30, the first electrode 40, and the second electrode 50 are referred to as the storage element 100. The storage element 100 is an example of a magnetic domain wall movement element. The semiconductor device 200 illustrated in FIG. 1 has a top pin structure in which the magnetic recording layer 20 is located closer to the substrate 60 than the first ferromagnetic layer 10.

"Substrate, Gate Electrode, and Gate Insulating Film"

The substrate 60 is, for example, a semiconductor substrate. The substrate 60 includes a plurality of source regions S1, S2, and S3 and a plurality of drain regions D1, D2, and D3. The plurality of source regions S1, S2, and S3 and the plurality of drain regions D1, D2, and D3 are regions having impurities doped in the substrate 60. The source region S1, the drain region D1, the gate electrode G1, and the gate insulating film GI1 serve as a first transistor Tr1. The source region S2, the drain region D2, the gate electrode G2, and the gate insulating film GI2 serve as a second transistor Tr2. The source region S3, the drain region D3, the gate electrode G3, and the gate insulating film GI3 serve as a third transistor Tr3.

"Insulating Layer"

The insulating layers 80 each are insulating layers which insulate between wirings of multilayer wirings and between elements. The insulating layer 80 electrically separates the substrate 60, the first wiring Cm, the second wiring Wp, the third wiring Rp, and the storage element 100 except for the conductive sections 90.

The same material as that used for a semiconductor device or the like can be used for the insulating layer 80. The insulating layer 80 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), and the like.

"Wiring"

The first wiring Cm is a common wiring. The common wiring is a wiring used both at the time of writing data and at the time of reading data. The second wiring Wp is a write wiring. The write wiring is a wiring used at the time of writing data. The third wiring Rp is a read wiring. The read wiring is a wiring used at the time of reading data. If the first transistor Tr1 and the third transistor Tr3 are turned on, the second wiring Wp and the first wiring Cm are electrically connected and a write current flows through the storage element 100. If the second transistor Tr1 and the third transistor Tr3 are turned on, the third wiring Wp and the first wiring Cm are electrically connected and a read current flows through the storage element 100.

"Conductive Section"

Each of the conductive sections 90 electrically connects each of the first wiring Cm, the second wiring Wp, the third wiring Rp, and the storage element 100 to the substrate 60. The conductive section 90 includes a material having conductivity. A conductive section 91 electrically connects the second wiring Wp to the source region S1 of the first transistor Tr1. A conductive section 92 electrically connects the second electrode 50 to the drain region D1 of the first transistor Tr1. A conductive section 93 electrically connects the third wiring Rp to the source region S2 of the second transistor Tr2. A conductive section 94 electrically connects a wiring 71 to the drain region D2 of the second transistor Tr2. A conductive section 95 electrically connects the first wiring Cm to the source region S3 of the third transistor Tr3. A conductive section 96 electrically connects the first electrode 40 to the drain region D3 of the third transistor Tr3. The conductive sections 91, 92, 93, 94, 95, and 96 extend in the z direction.

"Third Electrode"

The third electrode 70 is an electrode configured to flow a read current through the storage element 100. The third electrode 70 includes a material having conductivity. The third electrode 70 is connected to the conductive section 94 using the wiring 71.

"Storage Element"

Figure 2:
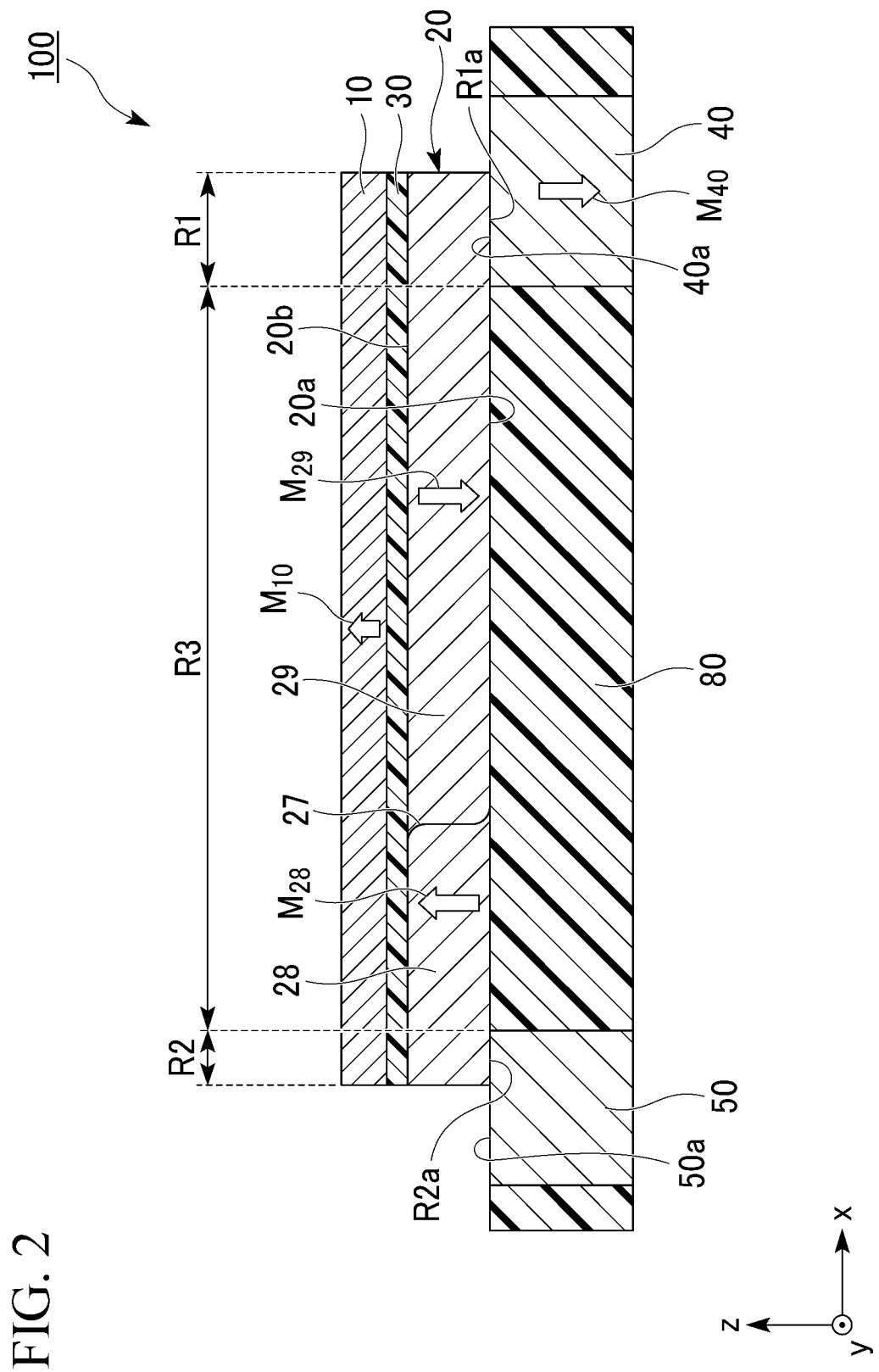
FIG. 2 is a cross-sectional view of a storage element according to the first embodiment.
Figure 3:
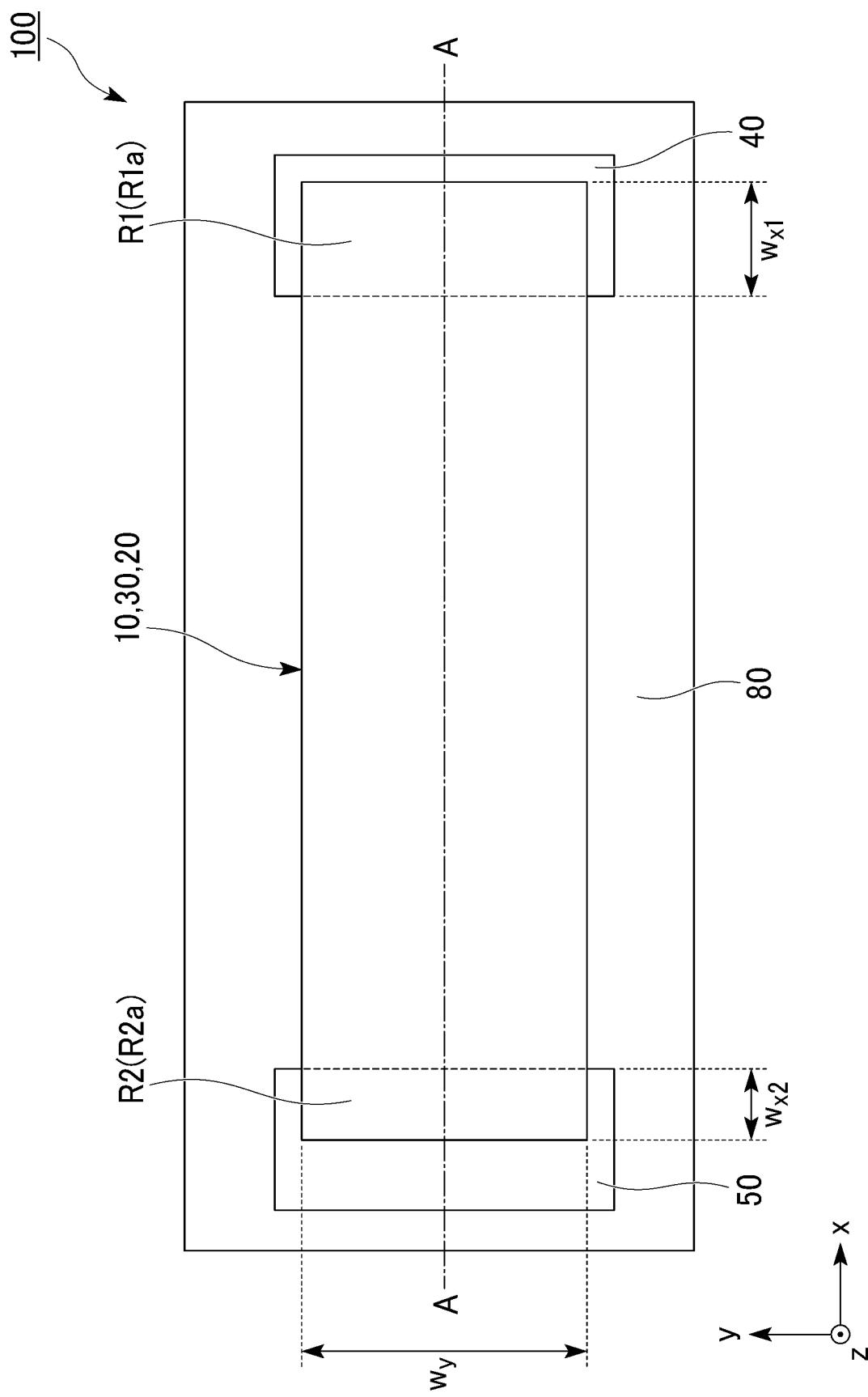
FIG. 3 is a plan view of the storage element according to the first embodiment.

FIG. 2 is an enlarged cross-sectional view of the vicinity of the storage element 100 of the semiconductor device according to the first embodiment. FIG. 3 is a plan view of the storage element 100 of the semiconductor device according to the first embodiment. The storage element 100 includes the first ferromagnetic layer 10, the magnetic recording layer 20, the nonmagnetic layer 30, the first electrode 40, and the second electrode 50. FIG. 2 is a cross-sectional view of the storage element 100 taken along the xz plane (plane A-A in FIG. 3) passing through the center of the magnetic recording layer in the y direction. In FIG. 2, the insulating layer 80 around the magnetic recording layer 20, the nonmagnetic layer 30, and the first ferromagnetic layer 10 are omitted for simplicity.

"First Electrode and Second Electrode"

The first electrode 40 and the second electrode 50 are located on an opposite side of the nonmagnetic layer 30 with respect to the magnetic recording layer 20. The first electrode 40 and the second electrode 50 are located inside the insulating layer 80. The first electrode 40 is located between the magnetic recording layer 20 and the conductive section 96 and the second electrode 50 is located between the magnetic recording layer 20 and the conductive section 92. At least a part of the first electrode 40 and the magnetic recording layer 20 overlap in the z direction. At least a part of the second electrode 50 and the magnetic recording layer 20 overlap in the z direction.

Shapes of the first electrode 40 and the second electrode 50 when viewed in a plan view from the z direction are not particularly limited. For example, the first electrode 40 and the second electrode 50 illustrated in FIG. 3 are rectangular when viewed in a plan view from the z direction.

The first electrode 40 includes a magnetic material. The first electrode 40 has, for example, a magnetization $M_{40}$ oriented in one direction. A direction of the magnetization $M_{40}$ of the first electrode 40 is different from a direction of a magnetization $M_{10}$ of the first ferromagnetic layer 10. The magnetization $M_{40}$ illustrated in FIG. 2 is oriented, for example, in a −z direction. A coercivity of the first electrode 40 is larger than a coercivity of a third region R3 of the magnetic recording layer 20 which will be described later. The coercivity of the third region R3 is substantially equal to a coercivity of the magnetic recording layer 20 when the magnetic recording layer 20 is formed above the insulating layer 80 in which the first electrode 40 and the second electrode 50 are not provided.

A difference in coercivity between the first electrode 40 and the third region R3 can be adjusted according to selection of a material constituting the first electrode 40 and a material constituting the magnetic recording layer 20. Furthermore, the first electrode 40 may be formed to have a synthetic antiferromagnetic structure (an SAF structure). The synthetic antiferromagnetic structure is composed of two magnetic layers having a nonmagnetic layer disposed therebetween. Magnetizations of the two magnetic layers are fixed and directions of the fixed magnetizations are opposite. For example, a nonmagnetic layer and a ferromagnetic layer are provided below the first electrode 40 illustrated in FIG. 1. When the first electrode 40 is coupled to the ferromagnetic layer, coercivity of the first electrode 40 increases.

The first electrode 40 is made of, for example, a metal selected from the group consisting of Cr, Mn, Co, Fe, and Ni, alloys containing at least one of these metals, alloys containing at least one metal of these metals and at least one element from B, C, and N, and the like. The first electrode 40 is made of, for example, Co—Fe, Co—Fe—B, Ni—Fe, or the like.

The second electrode 50 is a conductor. The second electrode is made of, for example, Al, Cu, Ag, or the like having excellent conductivity.

"Magnetic Recording Layer"

The magnetic recording layer 20 is located in the z direction from the first electrode 40 and the second electrode 50. The magnetic recording layer 20 is formed over first surfaces 40a and 50a. The magnetic recording layer 20 may be directly connected to the first surfaces 40a and 50a and may be connected to the first surfaces 40 and 50a via a layer therebetween.

The magnetic recording layer 20 is a layer on which information can be recorded using a change in internal magnetic state. The magnetic recording layer 20 is a magnetic layer located closer to the first electrode 40 and the second electrode 50 side than the nonmagnetic layer 30. The magnetic recording layer 20 extends in the x direction. The magnetic recording layer 20 illustrated in FIG. 2 has a rectangular shape in which the x direction of the magnetic recording layer 20 is a long axis and the y direction thereof is a short axis when viewed in a plan view from the z direction.

The magnetic recording layer 20 has a first magnetic domain 28 and a second magnetic domain 29 therein. A magnetization $M_{28}$ of the first magnetic domain 28 and a magnetization $M_{29}$ of the second magnetic domain 29 are oriented in opposite directions. A boundary between the first magnetic domain 28 and the second magnetic domain 29 is a magnetic domain wall 27. The magnetic recording layer 20 can have the magnetic domain wall 27 therein. In the storage element 100 illustrated in FIG. 2, the magnetization $M_{28}$ of the first magnetic domain 28 is oriented in a +z direction and the magnetization $M_{29}$ of the second magnetic domain 29 is oriented in the −z direction. Although a description will be provided using an example in which a magnetization is oriented in a z-axis direction below, magnetizations of the magnetic recording layer 20 and the first ferromagnetic layer 10 may be oriented in an x-axis direction and may be oriented in any direction in the xy plane.

The storage element 100 records data in a multi-valued manner or continuously in accordance with a position of the magnetic domain wall 27 of the magnetic recording layer 20. The data recorded on the magnetic recording layer 20 is read out as a change in resistance value of the storage element 100 when a read current is applied.

A ratio between the first magnetic domain 28 and the second magnetic domain 29 in the magnetic recording layer 20 changes if the magnetic domain wall 27 moves. The magnetization $M_{10}$ of the first ferromagnetic layer 10 is in the same direction (parallel) as the magnetization $M_{28}$ of the first magnetic domain 28 and is in an opposite direction (anti-parallel) to the magnetization $M_{29}$ of the second magnetic domain 29. If the magnetic domain wall 27 moves in a +x direction and an area of the first magnetic domain 28 in a portion in which the magnetic domain wall 27 and the first ferromagnetic layer 10 overlap when viewed in a plan view from the z direction increases, a resistance value of the storage element 100 decreases. On the other hand, if the magnetic domain wall 27 moves in a −x direction and an area of the second magnetic domain 29 in a portion in which the magnetic domain wall 27 and the first ferromagnetic layer 10 overlap when viewed in a plan view from the z direction increases, a resistance value of the storage element 100 increases.

The magnetic domain wall 27 moves when a write current flows through the magnetic recording layer 20 in the x direction thereof or an external magnetic field is applied to the magnetic recording layer 20. For example, if a write current (for example, a current pulse) is applied to the magnetic recording layer 20 in the +x direction thereof, the magnetic domain wall 27 moves. At this time, electrons flow in the −x direction opposite to that of a current. When a current flows from the first magnetic domain 28 toward the second magnetic domain 29, electrons spin-polarized in the second magnetic domain 29 reverse the magnetization $M_{28}$ of the first magnetic domain 28. The magnetic domain wall 27 moves when the magnetization $M_{28}$ of the first magnetic domain 28 reverses.

The magnetic recording layer 20 can be divided into a plurality of different regions. Hereinafter, the plurality of regions are referred to as a first region R1, a second region R2, and a third region R3 for convenience. A part of the magnetic recording layer 20 overlaps with the first electrode 40 and the second electrode 50 when viewed in a plan view from the z direction.

A region in which the magnetic recording layer 20, the first electrode 40, and the first ferromagnetic layer 10 overlap when viewed from the z direction is referred to as the first region R1. The first region R1 is, for example, a region of the magnetic recording layer 20 in which the magnetic recording layer 20, an upper surface of the first electrode 40, and a lower surface of the first ferromagnetic layer 10 overlap and is, for example, a region in which the first ferromagnetic layer 10, the magnetic recording layer 20, and the first electrode 40 overlap in the z direction among a region in which the magnetic recording layer 20 is in contact with the first electrode 40.

A region in which the magnetic recording layer 20, the second electrode 50, and the first ferromagnetic layer 10 overlap when viewed from the z direction is referred to as the second region R2. The second region R2 is, for example, a region of the magnetic recording layer 20 in which the magnetic recording layer 20, an upper surface of the second electrode 50, and the lower surface of the first ferromagnetic layer 10 overlap and is, for example, a region in which the first ferromagnetic layer 10, the magnetic recording layer 20, and the second electrode 50 overlap in the z direction among a region in which the magnetic recording layer 20 is in contact with the second electrode 50.

A region present between the first region R1 and the second region R2 is referred to as the third region R3. The third region R3 is, for example, a region of the magnetic recording layer 20 in which the first region R1 and the second region R2 are excluded.

A magnetization direction of the first region R1 is fixed by the magnetization $M_{40}$ of the first electrode 40. The magnetization of the second region R2 is not fixed. However, since the second region R2 is in contact with the second electrode 50, a current density of the second region R2 is smaller than a current density of the third region R3 and an amount of change of a current density when a current reaches the second region R2 from the third region R3 is larger than an amount of change of a current density of a current flowing in the third region. For this reason, the magnetic domain wall 27 does not easily enter the second region R2 from the third region R3 and a movement range of the magnetic domain wall 27 is limited.

The first region R1 has a first section R1a. The first section R1a is a surface in the first region R1 in which the magnetic recording layer 20 faces the first electrode 40. The first section R1a is, for example, a surface in the first region R1 in which the magnetic recording layer 20 is in contact with the first electrode 40. The second region R2 has a second section R2a. The second section R2a is a surface in the second region R2 in which the magnetic recording layer 20 faces the second electrode 50. The second section R2a is, for example, a surface in the second region R2 in which the magnetic recording layer 20 is in contact with the second electrode 50. An area of the first section R1a is larger than an area of the second section R2a. In the example illustrated in FIG. 3, widths $w_y$ of the first section R1a and the second section R2a in the y direction are the same and a width $w_{x1}$ of the first section R1a in the x direction is wider than a width $w_{x2}$ of the second section R2a in the x direction.

The magnetic recording layer 20 is made of a magnetic material. The magnetic material constituting the magnetic recording layer 20 can be a metal selected from the group consisting of Cr, Mn, Co, Fe, and Ni, alloys containing at least one of these metals, alloys containing at least one metal of these metals and at least one element from B, C, and N, or the like. To be specific, Co—Fe, Co—Fe—B, and Ni—Fe may be exemplified.

It is desirable that the magnetic recording layer 20 include at least one element selected from the group consisting of Co, Ni, Pt, Pd, Gd, Tb, Mn, Ge, and Ga. Examples of the material used for the magnetic recording layer 20 include a laminated film made of Co and Ni, a laminated film made of Co and Pt, a laminated film made of Co and Pd, a MnGa-based material, a GdCo-based material, and a TbCo-based material. Ferrimagnetic materials such as a MnGa-based material, a GdCo-based material, and a TbCo-based material have a small saturation magnetization and a small threshold value current for moving a magnetic domain wall. Furthermore, a laminated film made of Co and Ni, a laminated film made of Co and Pt, and a laminated film made of Co and Pd have a large coercivity and a slow moving speed of a magnetic domain wall.

"Nonmagnetic Layer"

The nonmagnetic layer 30 is located between the first ferromagnetic layer 10 and the magnetic recording layer 20. The nonmagnetic layer 30 is laminated on a second surface 20$b$ of the magnetic recording layer 20. The second surface 20$b$ is a surface opposite to the first surfaces 20$a$.

The nonmagnetic layer 30 is made of, for example, a nonmagnetic insulator, a semiconductor, or a metal. Examples of the nonmagnetic insulator include $Al_2O_3$, $SiO_2$, MgO, $MgAl_2O_4$, and materials in which Al, Si, and Mg are partially substituted with Zn, Be, or the like. These materials have a large band gap and excellent insulating properties. When the nonmagnetic layer 30 is formed of a nonmagnetic insulator, the nonmagnetic layer 30 is a tunnel barrier layer. Examples of nonmagnetic metals include Cu, Au, Ag, and the like. Furthermore, examples of a nonmagnetic semiconductor include Si, Ge, $CuInSe_2$, $CuGaSe_2$, $Cu(In, Ga)Se_2$, and the like.

A thickness of the nonmagnetic layer 30 is preferably 20 Å or more and more preferably 30 Å or more. If the thickness of the nonmagnetic layer 30 is large, a resistance area product (RA) of a recording element 100 increases. The resistance area product (RA) of the recording element 100 is preferably $1 \times 10^5$ $\Omega\mu m^2$ or more and more preferably $1 \times 10^6$ $\Omega\mu m^2$ or more. The resistance area product (RA) of the recording element 100 is represented by a product of an element resistance of one recording element 100 and an element cross-sectional area of the recording element 100 (an area of a virtual cross-section obtained by cutting the nonmagnetic layer 30 along the xy plane).

"First Ferromagnetic Layer"

The first ferromagnetic layer 10 is located in a +z direction of the nonmagnetic layer 30. The first ferromagnetic layer 10 faces the nonmagnetic layer 30. The first ferromagnetic layer 10 has a portion in which the first ferromagnetic layer 10 overlaps with a part of the first electrode 40 and a part of the second electrode 50 when viewed from the z direction. The first ferromagnetic layer 10 partially overlaps with the first region R1 and the second region R2 when viewed from the z direction.

The first ferromagnetic layer 10 is a magnetization fixed layer having a magnetization $M_{10}$ oriented in one direction. A direction in which the magnetization $M_{10}$ is oriented is opposite to a direction in which the magnetization $M_{40}$ of the first electrode 40 is oriented. A magnetization direction of the magnetization fixed layer is less likely to change than that of the magnetic recording layer 20 when a predetermined external force is applied to the magnetization fixed layer. A predetermined external force is, for example, an external force applied to magnetization using an external magnetic field or an external force applied magnetization using a spin-polarized current.

The first ferromagnetic layer 10 includes a ferromagnetic material. Examples of a ferromagnetic material constituting the first ferromagnetic layer 10 include a metal selected from the group consisting of Cr, Mn, Co, Fe, and Ni, an alloy containing at least one metal of these metals, an alloy containing at least one metal of these metals and at least one element of B, C, and N, and the like. To be specific, Co—Fe, Co—Fe—B, and Ni—Fe are exemplified.

A material constituting the first ferromagnetic layer 10 may be a Heusler alloy. The Heusler alloy is a half-metal and has a high spin polarization. The Heusler alloy is an intermetallic compound having a chemical composition of XYZ or $X_2YZ$. X represents a Co-, Fe-, Ni-, or Cu-group transition metal element or a noble metal element in the periodic table, Y represents a Mn-, V-, Cr-, or Ti-group transition metal or an element of the X type in the periodic table, and Z represents a typical element from Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

A film thickness of the first ferromagnetic layer 10 is preferably 1.5 nm or less and more preferably 1.0 nm or less when an easy magnetization axis of the first ferromagnetic layer 10 is assumed to a z direction (a perpendicular magnetization film is assumed). If the film thickness of the first ferromagnetic layer 10 is reduced, perpendicular magnetic anisotropy (interface perpendicular magnetic anisotropy) can be added to the first ferromagnetic layer 10 at an interface between the first ferromagnetic layer 10 and another layer (the nonmagnetic layer 30). Magnetization of the first ferromagnetic layer 10 is easily oriented in the z direction.

The magnetization of the first ferromagnetic layer 10 is fixed, for example, in the z direction. When the magnetization is fixed in the z direction, it is desirable that the first ferromagnetic layer 10 be a laminate of a ferromagnetic material selected from the group consisting of Co, Fe, and Ni and a nonmagnetic material selected from the group consisting of Pt, Pd, Ru, and Rh and it is more desirable to insert a nonmagnetic material selected from the group consisting of Ir and Ru as an intermediate layer at any position in the laminate. If a ferromagnetic material and a nonmagnetic material are laminated, it is possible to add perpendicular magnetic anisotropy and when the intermediate layer is inserted, it is possible to more strongly fix the magnetization of the first ferromagnetic layer 10 in a perpendicular direction.

The first ferromagnetic layer 10 may have an SAF structure. An antiferromagnetic layer may be provided on a surface of the first ferromagnetic layer 10 opposite to the nonmagnetic layer 30 via a spacer layer. If the first ferromagnetic layer 10 and an antiferromagnetic layer are antiferromagnetically coupled, coercivity of the first ferromagnetic layer 10 increases. The antiferromagnetic layer is, for example, IrMn, PtMn, or the like. The spacer layer includes, for example, at least one selected from the group consisting of Ru, Ir, and Rh.

The semiconductor device according to the first embodiment is obtained by laminating each layer and processing each of the layers to have a predetermined shape. Each of the layers can be laminated using a sputtering method, a chemical vapor deposition (CVD) method, an electron beam evaporation method (EB evaporation method), an atomic laser deposition method, or the like. Each of the layers can be processed using photolithography or the like.

In the storage element 100 according to the first embodiment, if the area of the first section R1*a* in the first region R1 is larger than the area of the second section R2*a* in the second region R2, a range (a dynamic range) of resistance change of the storage element 100 widens.

A resistance value of the storage element 100 changes on the basis of a difference between relative angles of magnetizations of two ferromagnetic materials (the first ferromagnetic layer 10 and the magnetic recording layer 20) having the nonmagnetic layer 30 disposed therebetween. The first ferromagnetic layer 10 reaches the first region R1 and the second region R2 when viewed in a plan view from the z direction. Therefore, the resistance value of the storage element 100 is determined using magnetization directions of the first region R1, the second region R2, and the third region R3. On the other hand, as described above, the magnetic domain wall 27 does not easily enter the first region R1 and the second region R2. That is to say, although the first region R1 and the second region R2 in which the directions of the magnetization thereof are fixed have a large influence on a reference resistance of data of "0" and "1" in the storage element 100, an influence on the resistance change of the storage element 100 is smaller than that of the third region R3.

In the storage element 100, a resistance value decreases when the magnetic domain wall 27 approaches the first region R1 and the resistance value increases when the magnetic domain wall 27 approaches the second region R2. If an area occupied by the first region R1 in the magnetic recording layer 20 increases, a minimum resistance value of the storage element 100 increases. Furthermore, if an area occupied by the second region R2 in the magnetic recording layer 20 increases, a maximum resistance value of the storage element 100 decreases. The storage element 100 can have a larger range of change in resistance when a minimum resistance value increases compared with when a maximum resistance value decreases.

A specific example will be illustrated and described below. First, as assumption conditions, when there is no domain wall 27 and the magnetization $M_{10}$ of the first ferromagnetic layer 10 and the magnetization $M_{28}$ of the magnetic recording layer 20 are fully parallel in the entire region, a resistance value indicated by the storage element 100 is assumed to be 100Ω. In addition, when there is no magnetic domain wall 27 and the magnetization $M_{10}$ of the first ferromagnetic layer 10 and the magnetization $M_{29}$ of the magnetic recording layer 20 are fully antiparallel in the entire region, a resistance value indicated by the storage element 100 is assumed to be 200Ω. In this case, the storage element 100 has a maximum range of change in resistance of 100Ω. On the other hand, when the first region R1 and the second region R2 are present, a movement range of the magnetic domain wall 27 is limited to the third region R3. Thus, the magnetization $M_{10}$ of the first ferromagnetic layer 10 and the magnetizations $M_{28}$ and $M_{29}$ of the magnetic recording layer 20 cannot be fully parallel or fully antiparallel. That is to say, a range of change in resistance of the storage element 100 is less than 100Ω.

First, as Comparative Example 1, a range of change in resistance of a storage element 100 when a first region R1 and a second region R2 each occupy regions corresponding to 10% of a magnetic recording layer 20 is obtained. The storage element 100 indicates a minimum resistance value when a magnetic domain wall 27 is located at a boundary between the first region R1 and a third region R3 and indicates a maximum resistance value when the magnetic domain wall 27 is located at a boundary between the second region R2 and the third region R3. When the storage element 100 indicates the minimum resistance value, a magnetization $M_{28}$ corresponding to 90% of the magnetic recording layer 20 is parallel to a magnetization $M_{10}$ of a first ferromagnetic layer 10 and a magnetization $M_{29}$ corresponding to 10% of the magnetic recording layer 20 is antiparallel to a magnetization $M_{10}$ of the first ferromagnetic layer 10. The minimum resistance value indicated by the storage element 100 is 105.3Ω. On the other hand, when the storage element 100 indicates the maximum resistance value, the magnetization $M_{28}$ corresponding to 10% of the magnetic recording layer 20 is parallel to the magnetization $M_{10}$ of the first ferromagnetic layer 10 and the magnetization $M_{29}$ corresponding to 90% of the magnetic recording layer 20 is antiparallel to the magnetization $M_{10}$ of the first ferromagnetic layer 10. The maximum resistance value indicated by the storage element 100 is 181.8Ω. A range of change in resistance of the storage element 100 is 76.6Ω and an MR ratio of the storage element 100 is 72.7.

Next, as Comparative Example 2, a range of change in resistance of a storage element 100 when a first region R1 occupies a region corresponding to 5% of a magnetic recording layer 20 and a second region R2 occupies a region corresponding to 15% of the magnetic recording layer 20 is obtained. When the storage element 100 indicates a minimum resistance value, a magnetization $M_{28}$ corresponding to 95% of the magnetic recording layer 20 is parallel to a magnetization $M_{10}$ of the first ferromagnetic layer 10 and the magnetization $M_{29}$ corresponding to 5% of the magnetic recording layer 20 is antiparallel to the magnetization $M_{10}$ of the first ferromagnetic layer 10. The minimum resistance value indicated by the storage element 100 is 102.6Ω. On the other hand, when the storage element 100 indicates the maximum resistance value, a magnetization $M_{28}$ corresponding to 15% of the magnetic recording layer 20 is parallel to the magnetization $M_{10}$ of the first ferromagnetic layer 10 and a magnetization $M_{29}$ corresponding to 85% of the magnetic recording layer 20 is antiparallel to the magnetization $M_{10}$ of the first ferromagnetic layer 10. The maximum resistance value indicated by the storage element 100 is 173.9Ω. A range of change in resistance of the storage element 100 is 71.3Ω and an MR ratio of the storage element 100 is 69.6.

Finally, as Example 1, a range of change in resistance of a storage element 100 when a first region R1 occupies a region corresponding to 15% of a magnetic recording layer 20 and a second region R2 occupies a region corresponding to 5% of the magnetic recording layer 20 is obtained. When the storage element 100 indicates a minimum resistance value, a magnetization $M_{28}$ corresponding to 85% of the magnetic recording layer 20 is parallel to a magnetization $M_{10}$ of a first ferromagnetic layer 10 and a magnetization $M_{29}$ corresponding to 15% of the magnetic recording layer 20 is antiparallel to the magnetization $M_{10}$ of the first ferromagnetic layer 10. The minimum resistance value indicated by the storage element 100 is 105.3Ω. On the other hand, when the storage element 100 indicates a maximum resistance value, a magnetization $M_{28}$ corresponding to 5% of the magnetic recording layer 20 is parallel to the magnetization $M_{10}$ of the first ferromagnetic layer 10 and a magnetization $M_{29}$ corresponding to 95% of the magnetic recording layer 20 is antiparallel to the magnetization $M_{10}$ of the first ferromagnetic layer 10. The maximum resistance value indicated by the storage element 100 is 190.5Ω. A range of change in resistance of the storage element 100 is 82.4Ω and an MR ratio of the storage element 100 is 76.2.

As illustrated in Example 1, Comparative Example 1, and Comparative Example 2, if proportions in the magnetic recording layer 20 occupied by the first region R1 and proportions in the magnetic recording layer 20 occupied by the second region R2 are changed, the ranges of change in resistance of the MR ratios of the storage element 100 change. In Example 1, the proportion in the magnetic recording layer 20 occupied by the first region R1 is larger than the proportion in the magnetic recording layer 20 occupied by the second region R2. Thus, the range of change in resistance and the MR ratio of the storage element 100 are larger than those in Comparative Example 1 and Comparative Example 2. This relationship is not limited to these examples and is not limited also when percentages occupied by the first region R1 and the second region R2 are changed and if a value of a resistance value set as an assumption condition is changed on the assumption that the proportion in the magnetic recording layer 20 occupied by the first region R1 is larger than the proportion in the magnetic recording layer 20 occupied by the second region R2.

That is to say, in the storage element 100 according to the first embodiment, an area of the first section R1a in the first region R1 is larger than an area of the second section R2a in the second region R2. Thus, a range (a dynamic range) of a resistance change of the storage element 100 is wide.

The storage element 100 can record data not in a digital signal of "1" and "0" but in an analog manner. For this reason, the semiconductor device 200 functions as a neuromorphic device configured to imitate the brain.

Magnetization directions of the first ferromagnetic layer 10, the magnetic recording layer 20, and the first electrode 40 in the storage element 100 can be confirmed by, for example, measuring a magnetization curve. The magnetization curve can be measured, for example, using a magneto optical Kerr effect (MOKE). The measurement using the MOKE is a measurement method in which linearly polarized light is incident on an object to be measured and which is performed using a magnetooptical effect (a magnetic Kerr effect) in which rotation or the like of a polarization direction occurs.

For example, a case in which an orientation direction of the magnetization of each of the first region R1, the second region R2, and the third region R3 in the magnetic recording layer 20 is measured will be described in detail as an example. First, the storage element 100 is ground in the z direction and the first ferromagnetic layer 10 is removed. Since the nonmagnetic layer 30 has a large influence on the orientation direction of the magnetization of the magnetic recording layer 20, a part of the nonmagnetic layer 30 remains. Subsequently, a magnetic field sufficient to orient the magnetizations $M_{28}$ and $M_{29}$ of the magnetic recording layer 20 in one direction is applied in a predetermined direction. Moreover, the magnetization curve is measured while an applied magnetic field gradually decreases. A place to be measured is a central position on the xy plane of each of the first region R1, the second region R2, and the third region R3. In the measured magnetization curve, it is possible to identify a magnetization direction due to the positive and negative of magnetization when the applied magnetic field is zero for the first time. It is possible to also measure magnetization directions of the first ferromagnetic layer 10 and the first electrode 40 in the same manner.

Although the preferred embodiments of the present invention have been described in detail above, the present invention is not limited to specific embodiments and various modifications and changes are possible without departing from the gist of the present invention described in the claims.

(First Modification)

Figure 4:
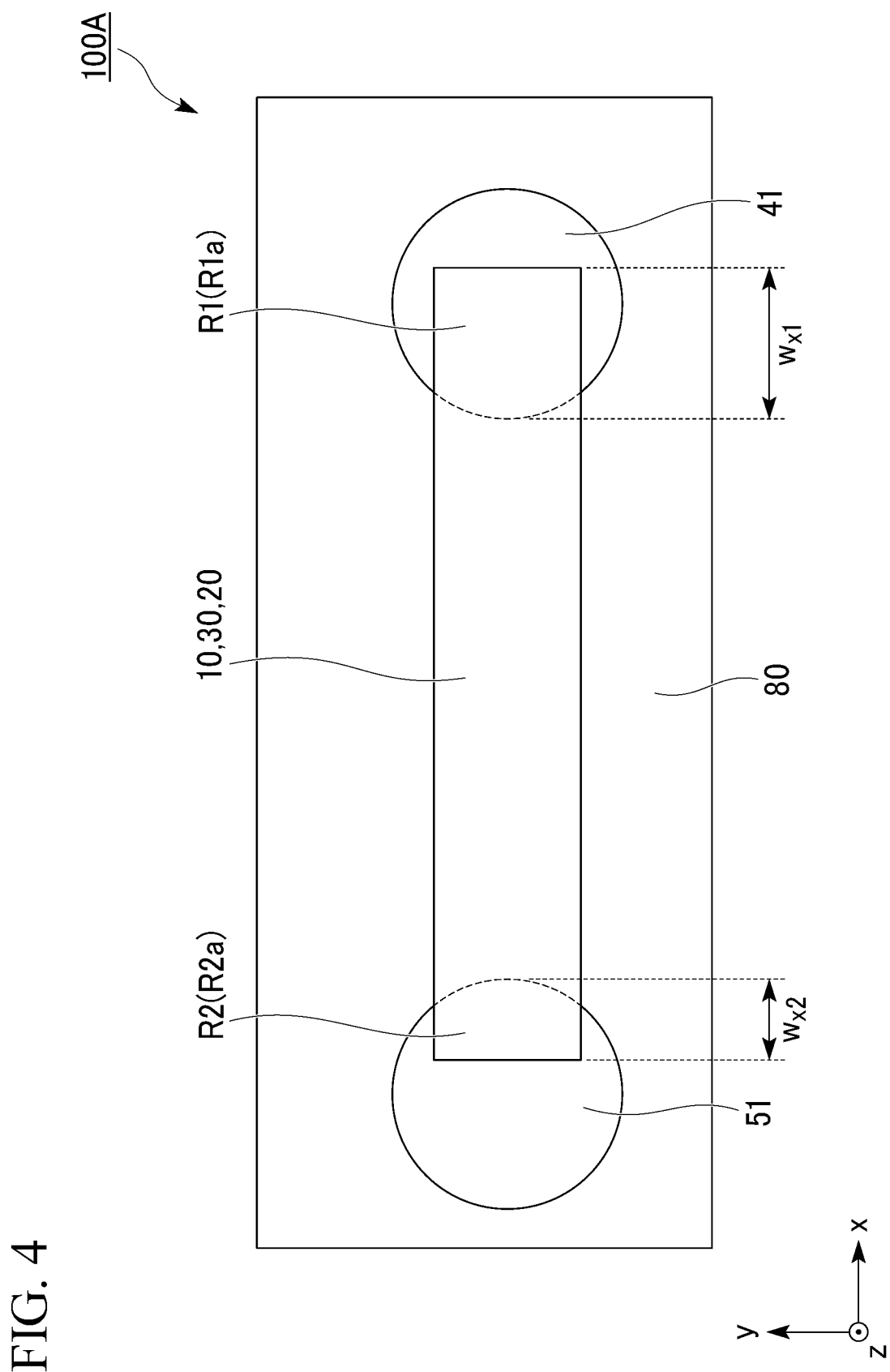
FIG. 4 is a plan view of a first modification of the storage element of the semiconductor device according to the first embodiment.

FIG. 4 is a schematic plan view of a first modification of the semiconductor device according to the first embodiment. A storage element 100A illustrated in FIG. 4 and the storage element 100 illustrated in FIG. 3 differ in that shapes of a first electrode 41 and a second electrode 51 when viewed in a plan view from the z direction have circular shapes. Other constitutions illustrated in FIG. 4 are the same as those of the storage element 100 illustrated in FIG. 3, constituent elements in FIG. 4 that are the same as those of FIG. 3 will be denoted with the same reference numerals as in FIG. 3, and a description thereof will be omitted.

A magnetic recording layer 20 overlaps with a first electrode 41 and a second electrode 51 when viewed in a plan view from the z direction. An area of a first section R1a illustrated in FIG. 4 is larger than an area of a second section R2a. In the example illustrated in FIG. 4, a maximum width $w_{x1}$ in the x direction of a portion in which the first section R1a and the magnetic recording layer 20 overlap is larger than a maximum width $w_{x2}$ in the x direction of a portion in which the second section R2a and the magnetic recording layer 20 overlap. Also in the storage element 100A according to the first modification, an area of a first section R1a in a first region R1 is larger than an area of a second section R2a in a second region R2. Thus, a range (a dynamic range) of a resistance change of the storage element 100A is wide. Furthermore, shapes of the first electrode 41 and the second electrode 51 when viewed in a plan view from the z direction are not limited to the rectangular shape illustrated in FIG. 3 and the circular shape illustrated in FIG. 4 and it is possible to select various shapes.

(Second Modification)

Figure 5:
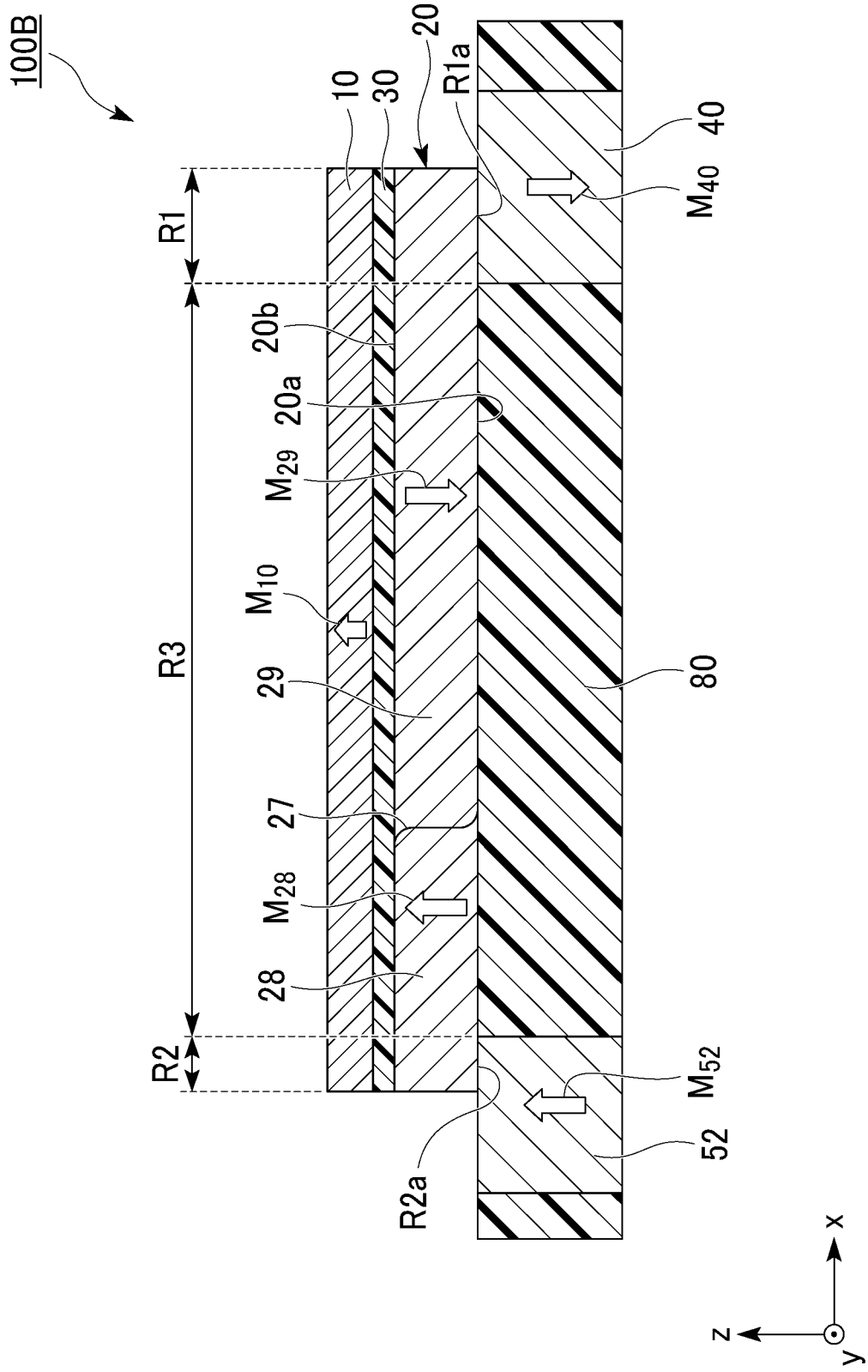
FIG. 5 is a cross-sectional view of a second modification of the storage element of the semiconductor device according to the first embodiment.

FIG. 5 is a schematic cross-sectional view of a second modification of the semiconductor device according to the first embodiment. A storage element 100B illustrated in FIG. 5 and the storage element 100 illustrated in FIG. 2 differ in that a second electrode 52 in the storage element 100B illustrated in FIG. 5 is made of a magnetic material. Other constitutions illustrated in FIG. 5 are the same as those of the storage element 100 illustrated in FIG. 1, constituent elements in FIG. 5 that are the same as those of FIG. 1 will be denoted with the same reference numerals as in FIG. 1, and a description thereof will be omitted.

A second electrode 52 includes a magnetic material. The second electrode 52 has, for example, a magnetization $M_{52}$ oriented in one direction. A direction of the magnetization $M_{52}$ of the second electrode 52 is the same as a direction of a magnetization $M_{10}$ of a first ferromagnetic layer 10 and is opposite to a direction of a magnetization $M_{40}$ of a first electrode 40. The magnetization $M_{52}$ illustrated in FIG. 5 is oriented in the +z direction. Coercivity of the second electrode 52 is larger than coercivity of a third region R3 of a magnetic recording layer 20.

For the second electrode 52, the same constitution and material as in the first electrode 40 can be used. For example, the second electrode may have a synthetic antiferromagnetic structure.

Also in the storage element 100B according to the second modification, an area of a first section R1a in a first region R1 is larger than an area of a second section R2a in a second region R2. Thus, a range (a dynamic range) of a resistance change of the semiconductor device 100B is wide. The magnetization $M_{52}$ of the second electrode 52 fixes a magnetization of the second region R2 in the magnetic recording layer 20. When the magnetization of the second region R2 is fixed, it is possible to further prevent the magnetic domain wall 27 from entering the second region R2.

(Third Modification)

Figure 6:
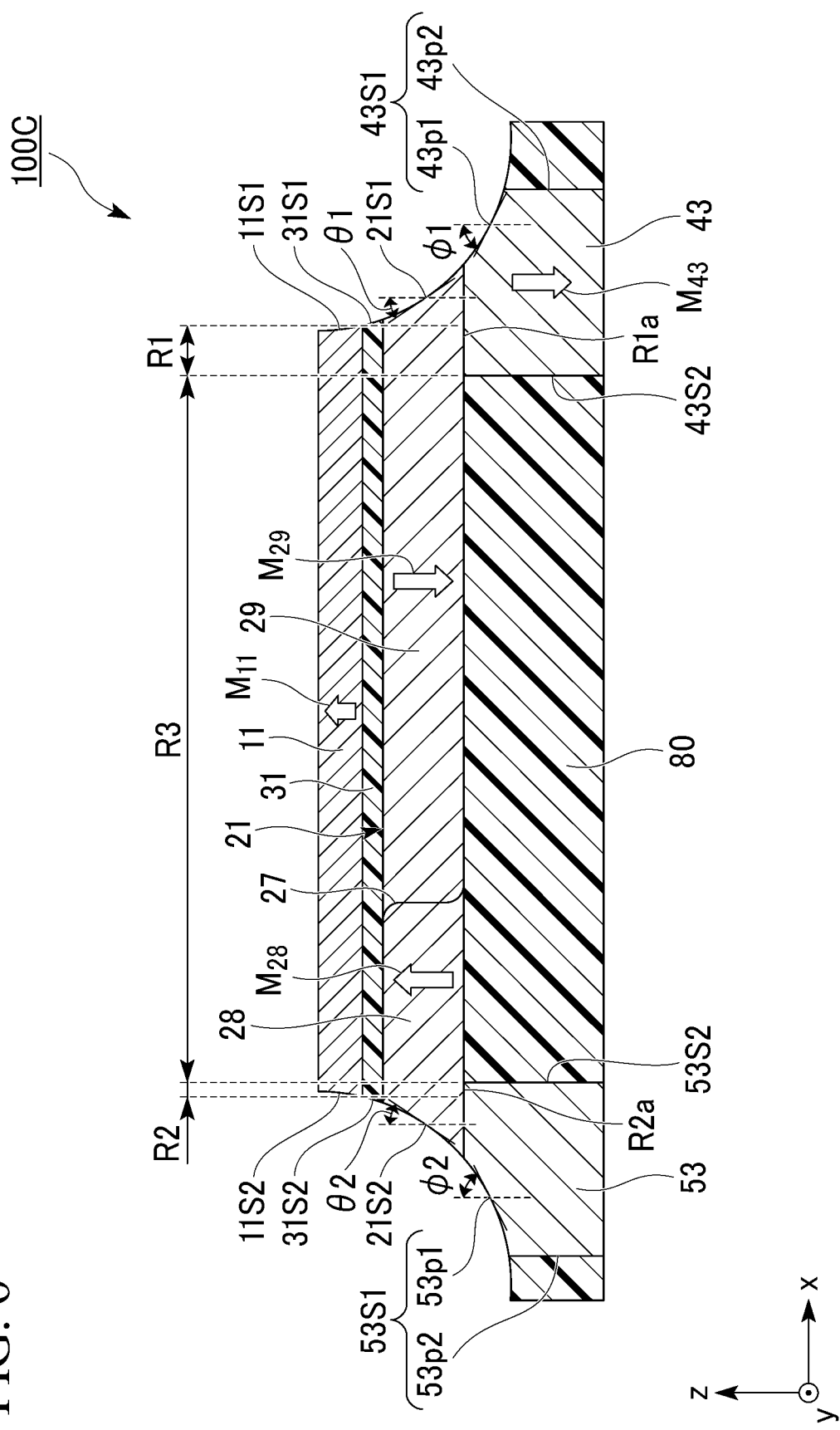
FIG. 6 is a schematic cross-sectional view of a third modification of the storage element of the semiconductor device according to the first embodiment.
Figure 7:
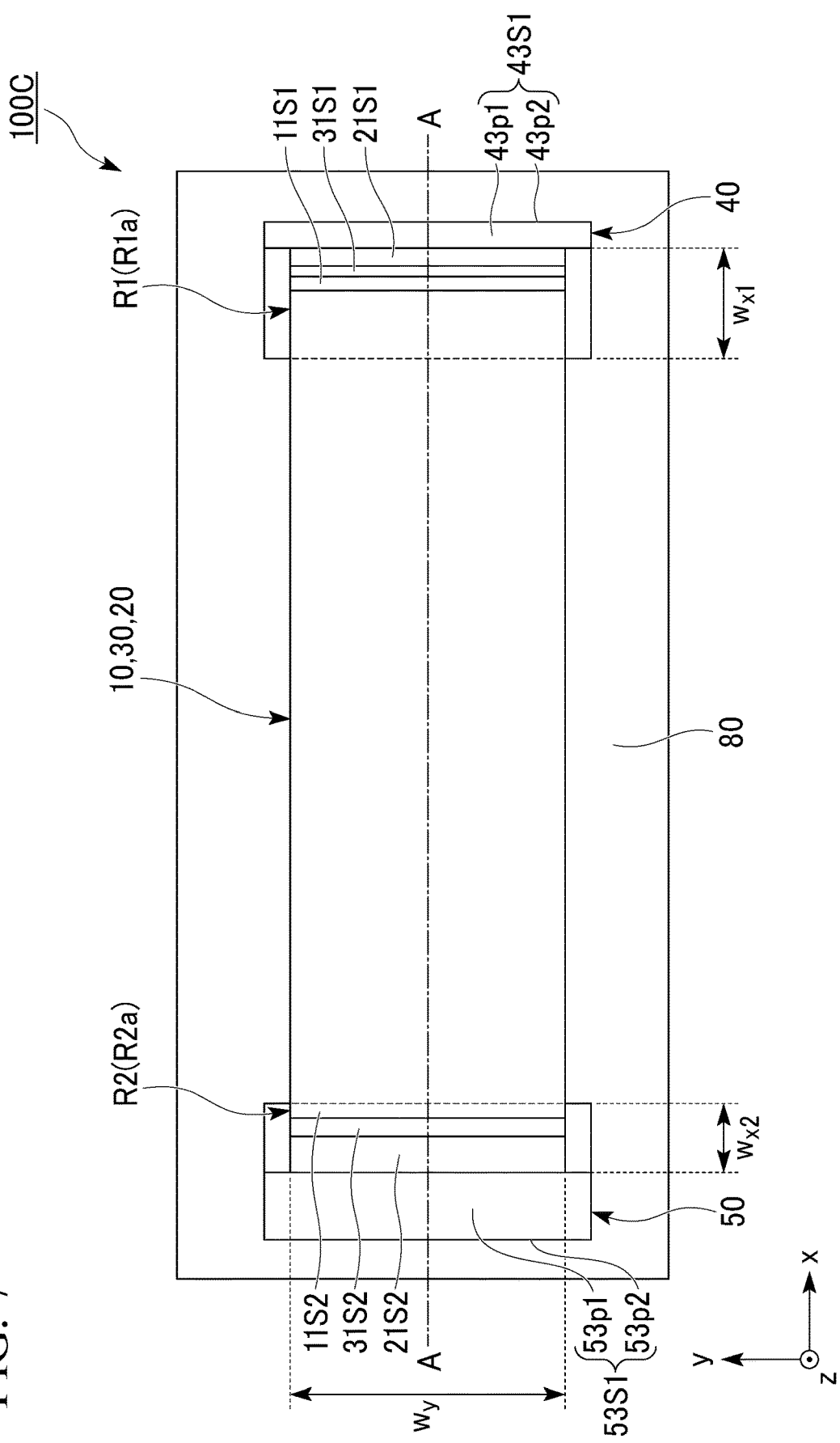
FIG. 7 is a schematic plan view of the third modification of the storage element of the semiconductor device according to the first embodiment.

FIG. 6 is a schematic cross-sectional view of a third modification of the storage element of the semiconductor device according to the first embodiment. FIG. 7 is a schematic plan view of the third modification of the storage element of the semiconductor device according to the first embodiment. FIG. 6 is the cross-sectional view of the storage element cut along an xz plane in a plane A-A in FIG. 7. A storage element 100C and the storage element 100 illustrated in FIG. 1 differ in that a shape of a lateral surface of a storage element in the x direction in the storage element 100C is different. Other constitutions illustrated in FIG. 6 are the same as those of the storage element 100 illustrated in FIG. 1, constituent elements in FIG. 6 that are the same as those of FIG. 1 will be denoted with the same reference numerals as in FIG. 1, and a description thereof will be omitted.

A first ferromagnetic layer 11 has a magnetization $M_{11}$ and has a first lateral surface 11S1 and a second lateral surface 11S2 in the x direction. A nonmagnetic layer 31 has a first lateral surface 31S1 and a second lateral surface 31S2 in the x direction. A magnetic recording layer 21 has a first lateral surface 21S1 and a second lateral surface 21S2 in the x direction. The first lateral surfaces 11S1, 31S1, and 21S1 are lateral surfaces closer to a first electrode 43 among two lateral surfaces in the x direction of each of the first ferromagnetic layer 11, the nonmagnetic layer 31, and the magnetic recording layer 21. The second lateral surfaces 11S2, 31S2, and 21S2 are lateral surfaces closer to a second electrode 53 among two lateral surfaces in the x direction of each of the first ferromagnetic layer 11, the nonmagnetic layer 31, and the magnetic recording layer 21. The first lateral surfaces 11S1, 31S1, and 21S1 and the second lateral surfaces 11S2, 31S2, and 21S2 are inclined with respect to the z direction. A tangent of the first lateral surfaces 11S1, 31S1, and 21S1 has, for example, an inclination angle θ1 with respect to the z direction. A tangent of the second lateral surfaces 11S2, 31S2, and 21S2 has, for example, an inclination angle θ2 with respect to the z direction. Furthermore, the inclination angles θ1 and θ2 may be constant regardless of positions of tangential contacts at which tangents are drawn or may change in accordance with positions of tangential contacts at which tangents are drawn. The inclination angles θ1 and θ2 illustrated in FIG. 6 change in accordance with positions at which tangents are drawn.

The first electrode 43 has a magnetization $M_{43}$. The first electrode 43 has a first lateral surface 43S1 and a second lateral surface 43S2 in the x direction on a virtual cross-section passing through a center of the magnetic recording layer 20 in the y direction and cut along an xz plane. The second lateral surface 43S2 is located closer to the second electrode 53 than the first lateral surface 43S1. The first lateral surface 43S1 has a first inclined section 43p1 and a second section 43p2. The first inclined section 43p1 is inclined with respect to the z direction. A tangent of the first inclined section 43p1 has, for example, an inclination angle φ1 with respect to the z direction. The first inclined section 43p1 has an inclination angle with respect to the z direction larger than that of the second lateral surface 43S2. The first lateral surface 43S1 changes discontinuously at a boundary between the first inclined section 43p1 and the second section 43p2.

The first lateral surfaces 11S1, 31S1, and 21S1 and the first inclined section 43p1 are continuous. For example, in the xz plane, when asymptotes of the first lateral surfaces 11S1, 31S1, and 21S1 and the first inclined section 43p1 are drawn using a continuous straight line or curved line, the first lateral surfaces 11S1, 31S1, and 21S1 and the first inclined section 43p1 can be regarded as continuously changing.

The second electrode 53 has a first lateral surface 53S1 and a second lateral surface 53S2 in the x direction on a virtual cross-section passing through a center of the magnetic recording layer 20 in the y direction and cut along the xz plane. The second lateral surface 53S2 is located closer to the first electrode 43 than the first lateral surface 53S1. The first lateral surface 53S1 has a first inclined section 53p1 and a second section 53p2. The first inclined section 53p1 is inclined with respect to the z direction. A tangent of the first inclined section 53p1 has, for example, an inclination angle φ2 with respect to the z direction. The first inclined section 53p1 has an inclination angle with respect to the z direction larger than that of the second lateral surface 53S2. The first lateral surface 53S1 changes discontinuously at a boundary between the first inclined section 53p1 and the second section 53p2. The second lateral surfaces 11S2, 31S2, 21S2 and the first inclined sections 53p1 are continuous.

The first lateral surfaces 11S1, 31S1, 21S1, the second lateral surfaces 11S2, 31S2, and 21S2, and the first inclined sections 43p1 and 53p1 are formed by removing some of end portions thereof in the x direction from a laminate obtained by sequentially laminating the magnetic recording layer 20, the nonmagnetic layer 30, and the first ferromagnetic layer 10. The processing of the end portions is performed using ion milling, photolithography, or the like.

Magnetization generally has a different value in a region having a different state due to a crystal grain, a surface state, a step, etching damage, and the like and has a mutual influence. Portions exposed after the removal of the end portions in the x direction are damaged. Since the damaged portions may serve as pinning sites because surface states or the like thereof change.

Pinning sites are portion whose magnetization does not easily move. The pinning sites whose magnetization does not easily move due to damage have an influence on neighboring regions and has an effect of fixing magnetization more strongly. The first lateral surface 21S1 of the magnetic recording layer 20 serves as a pinning site and further fixes magnetization of the first region R1. The first inclined section 43p1 of the first electrode 43 serves as a pinning site and further fixes the magnetization $M_{43}$ of the first electrode 43. The first lateral surface 21S1 of the magnetic recording layer 20 serves as a pinning site and further fixes the magnetization of the first region R1. The second lateral surface 21S2 of the magnetic recording layer 20 serves as a pinning site and further fixes magnetization of the second region R2.

That is to say, the magnetizations of the first electrode 43, the first region R1, and the second region R2 do not easily reverse as compared with when the first inclined section 43p1, the first lateral surface 21S, and the second lateral surface 21S2 are not provided. When the magnetizations of the first region R1 and the second region R2 are fixed more strongly (the magnetizations thereof do not easily reverse), the magnetic domain wall 27 does not easily enter the first region R1 and the second region R2.

Also in the storage element 100C according to the third modification, an area of a first section R1a in a first region R1 is larger than an area of a second section R2a in a second region R2. Thus, a range (a dynamic range) of a resistance change of the storage element 100C is wide.

Although a case in which both lateral surfaces of the storage element 100C in the x direction are inclined has been described in the third modification, only one of the lateral surfaces may be inclined. Furthermore, the second electrode 53 may include a magnetic material.

(Fourth Modification)

Figure 8:
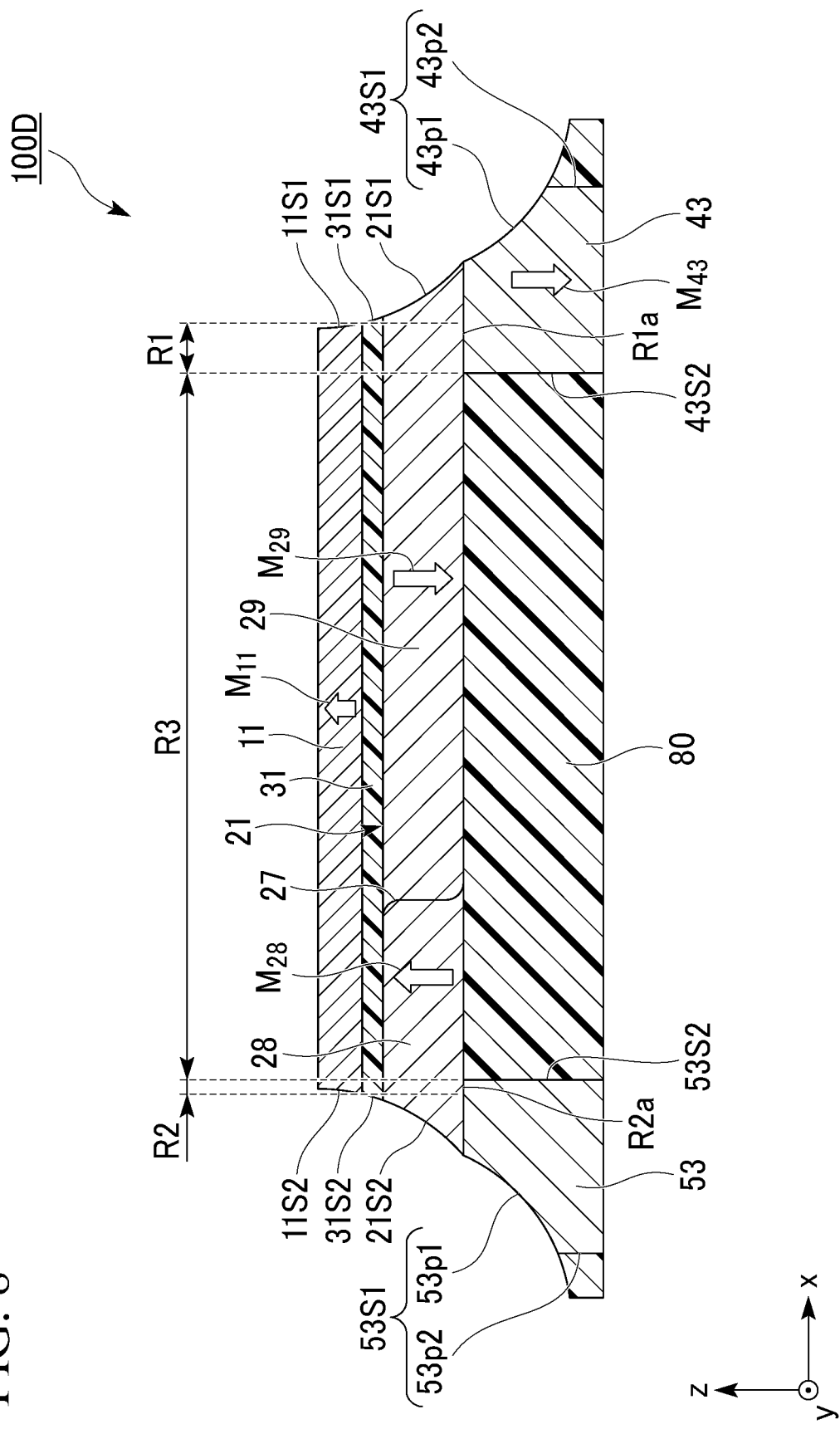
FIG. 8 is a schematic cross-sectional view of a fourth modification of the storage element of the semiconductor device according to the first embodiment.

FIG. 8 is a schematic cross-sectional view of a fourth modification of the storage element of the semiconductor device according to the first embodiment. A storage element 100D illustrated in FIG. 8 and the storage element 100C according to the third modification illustrated in FIG. 6 differ in that, in the storage element 100D illustrated in FIG. 8, first lateral surfaces 11S1, 31S1, and 21S1 and a first inclined section 43p1 are discontinuous and second lateral surfaces 11S2, 31S2, and 21S2 and a first inclined section 53p1 are discontinuous. Other constitutions illustrated in FIG. 8 are the same as those of the storage element 100C according to the third modification illustrated in FIG. 6, constituent elements in FIG. 8 that are the same as those of FIG. 6 will be denoted with the same reference numerals as in FIG. 6, and a description thereof will be omitted.

The first lateral surfaces 11S1, 31S1, and 21S1 and the first inclined section 43p1 may be discontinuous due to different etching rates in some cases. Similarly, the second lateral surfaces 11S2, 31S2, and 21S2 and the first inclined section 53p1 may be discontinuous in some cases.

Also in the storage element 100D according to the fourth modification, an area of a first section R1a in a first region R1 is larger than an area of a second section R2a in a second region R2. Thus, a range (a dynamic range) of a resistance change of the storage element 100D is wide.

Also, a first lateral surface 21S1 and a second lateral surface 21S2 in a magnetic recording layer 20, and a first inclined section 43p1 serve as pinning sites. When magnetizations of the first region R1 and the second region R2 are fixed more strongly (the magnetizations thereof do not easily reverse), the magnetic domain wall 27 does not easily enter the first region R1 and the second region R2.

Also, although a case in which both lateral surfaces of the storage element 100D in the x direction are inclined has been described in the fourth modification, only one of the lateral surfaces may be inclined. Furthermore, the second electrode 53 may include a magnetic material.

(Fifth Modification)

Figure 9:
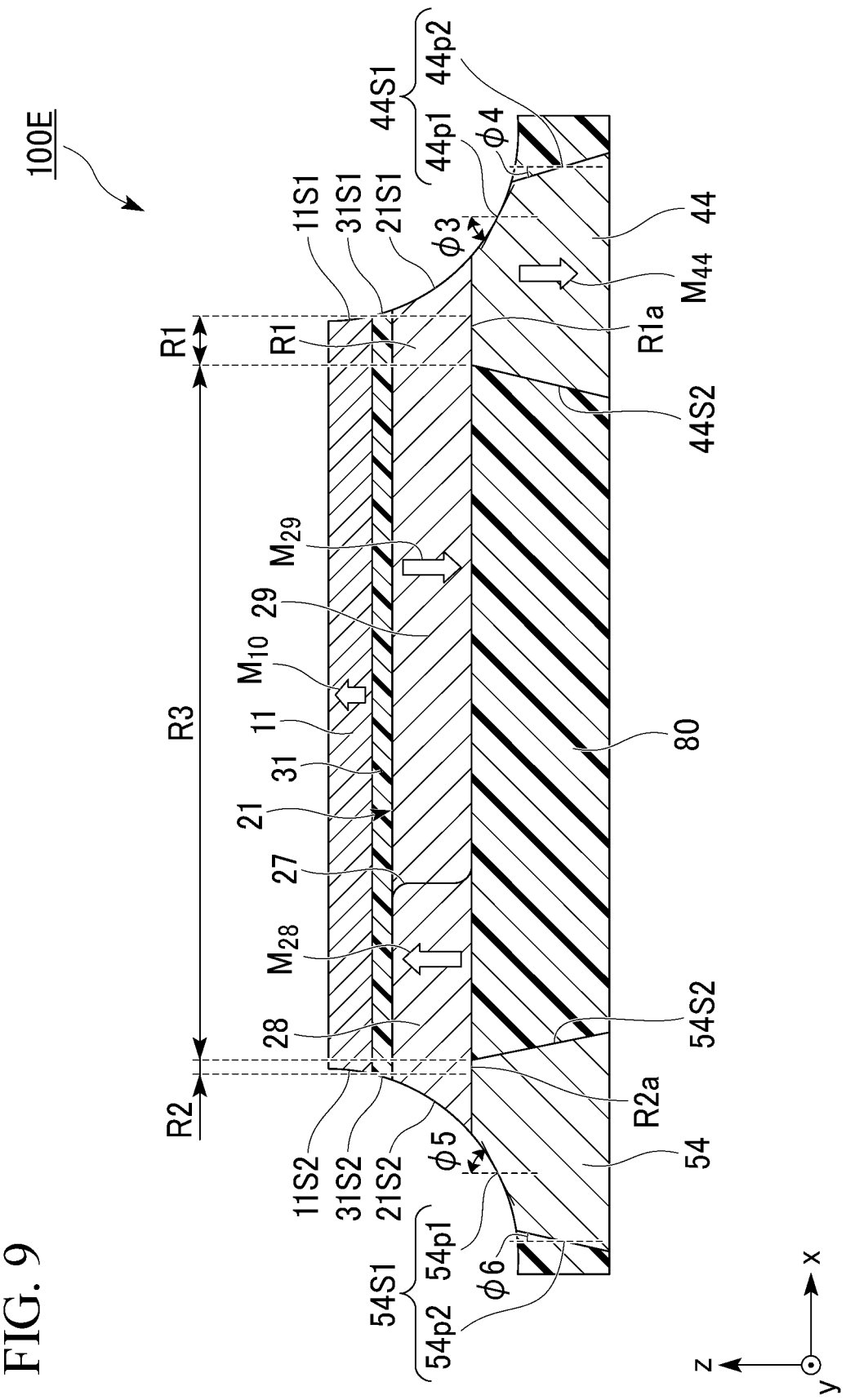
FIG. 9 is a schematic cross-sectional view of a fifth modification of the storage element according to the first embodiment.

FIG. 9 is a schematic cross-sectional view of a fifth modification of the storage element according to the first embodiment. Shapes of a first electrode 44 and a second electrode 54 in a storage element 100E illustrated in FIG. 9 are different from those of the storage element 100C according to the third modification described with reference to FIG. 6. Other constitutions illustrated in FIG. 9 are the same as those of the storage element 100C according to the third modification illustrated in FIG. 6, constituent elements in FIG. 9 that are the same as those of FIG. 6 will be denoted with the same reference numerals as in FIG. 6, and a description thereof will be omitted.

A first electrode 44 has a magnetization $M_{44}$. The first electrode 44 has a first lateral surface 44S1 and a second lateral surface 44S2 in the x direction on a virtual cross-section passing through a center of a magnetic recording layer 20 in the y direction and cut along the xz plane. The second lateral surface 44S2 is located closer to the second electrode 54 than the first lateral surface 44S1. The first lateral surface 44S1 has a first inclined section 44p1 and a second inclined section 44p2. The first inclined section 44p1 and the second inclined section 44p2 are inclined with respect to the z direction. A tangent of the first inclined section 44p1 has, for example, an inclination angle $\varphi 3$ with respect to the z direction. A tangent of the second inclined section 44p2 has, for example, an inclination angle $\varphi 4$ with respect to the z direction. The first inclined section 44p1 has an inclination angle with respect to the z direction larger than that of the second lateral surface 44S2. The first lateral surface 44S1 changes discontinuously at a boundary between the first inclined section 44p1 and the second inclined section 44p2.

The second electrode 54 has a first lateral surface 54S1 and a second lateral surface 54S2 in the x direction on a virtual cross-section cut along the xz plane. The second lateral surface 54S2 is located closer to the first electrode 44 than the first lateral surface 54S1. The first lateral surface 54S1 has a first inclined section 54p1 and a second inclined section 54p2. The first inclined section 54p1 and the second inclined section 54p2 are inclined with respect to the z direction. A tangent of the first inclined section 54p1 has, for example, an inclination angle $\varphi 5$ with respect to the z direction. A tangent of the second inclined section 54p2 has, for example, an inclination angle $\varphi 6$ with respect to the z direction. The first inclined section 54p1 has an inclination angle with respect to the z direction larger than that of the second lateral surface 54S2. The first lateral surface 54S1 changes discontinuously at a boundary between the first inclined section 54p1 and the second inclined section 54p2.

Also in the storage element 100E according to the fifth modification, an area of a first section R1a in a first region R1 is larger than an area of a second section R2a in a second region R2. Thus, a range (a dynamic range) of a resistance change of the storage element 100E is wide.

Also, a first lateral surface 21S1 and a second lateral surface 21S2 in the magnetic recording layer 20, and a first inclined section 44p1 serve as pinning sites. When magnetizations of the first region R1 and the second region R2 are fixed more strongly (the magnetizations thereof do not easily reverse), the magnetic domain wall 27 does not easily enter the first region R1 and the second region R2.

Also, although a case in which both lateral surfaces of the storage element 100E in the x direction are inclined has been described in the fifth modification, only one of the lateral surfaces may be inclined. Furthermore, shapes of the first electrode 44 and the second electrode 54 on a cut xz surface is not limited to trapezoid shapes in which lengths of upper bases of the electrodes in the +z direction are shorter than lengths of lower bases of the electrodes in the −z direction and may be trapezoid shapes in which lengths of upper bases of the electrodes in the +z direction are longer than lengths of lower bases of the electrodes in the −z direction. In addition, the second electrode 54 may include a magnetic material.

Second Embodiment

Figure 10:
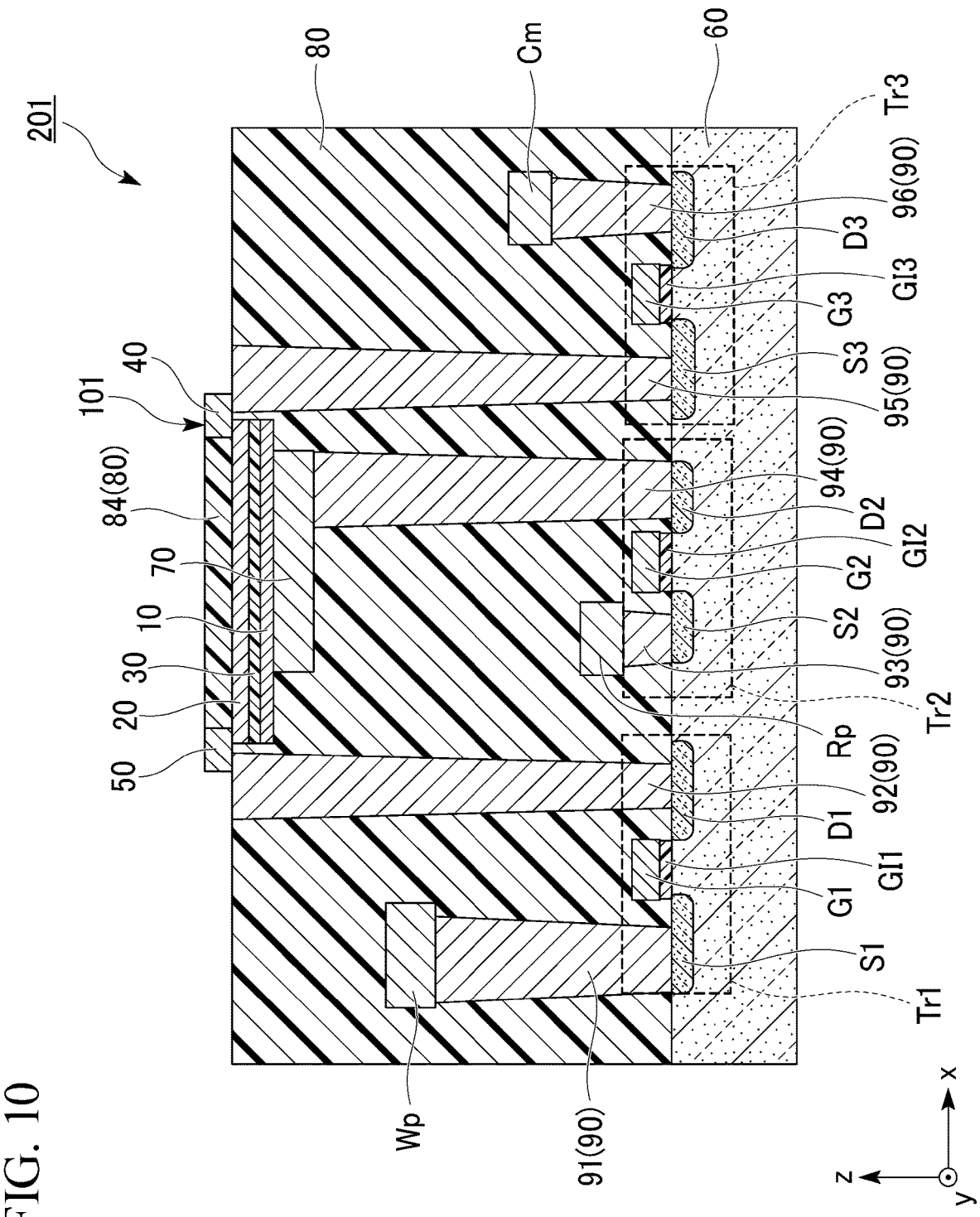
FIG. 10 is a schematic cross-sectional view of a semiconductor device according to a second embodiment.

FIG. 10 is a schematic cross-sectional view of a semiconductor device according to a second embodiment. A semiconductor device 201 illustrated in FIG. 10 and the semiconductor device 200 according to the first embodiment differ in that the semiconductor device 201 illustrated in FIG. 10 has a bottom pin structure in which a first ferromagnetic layer 10 is located closer to a substrate 60 than a magnetic recording layer 20. Other constitutions illustrated in FIG. 10 are the same as those of the semiconductor device 200 illustrated in FIG. 1, constituent elements in FIG. 10 that are the same as those of FIG. 1 will be denoted with the same reference numerals as in FIG. 1, and a description thereof will be omitted.

Figure 11:
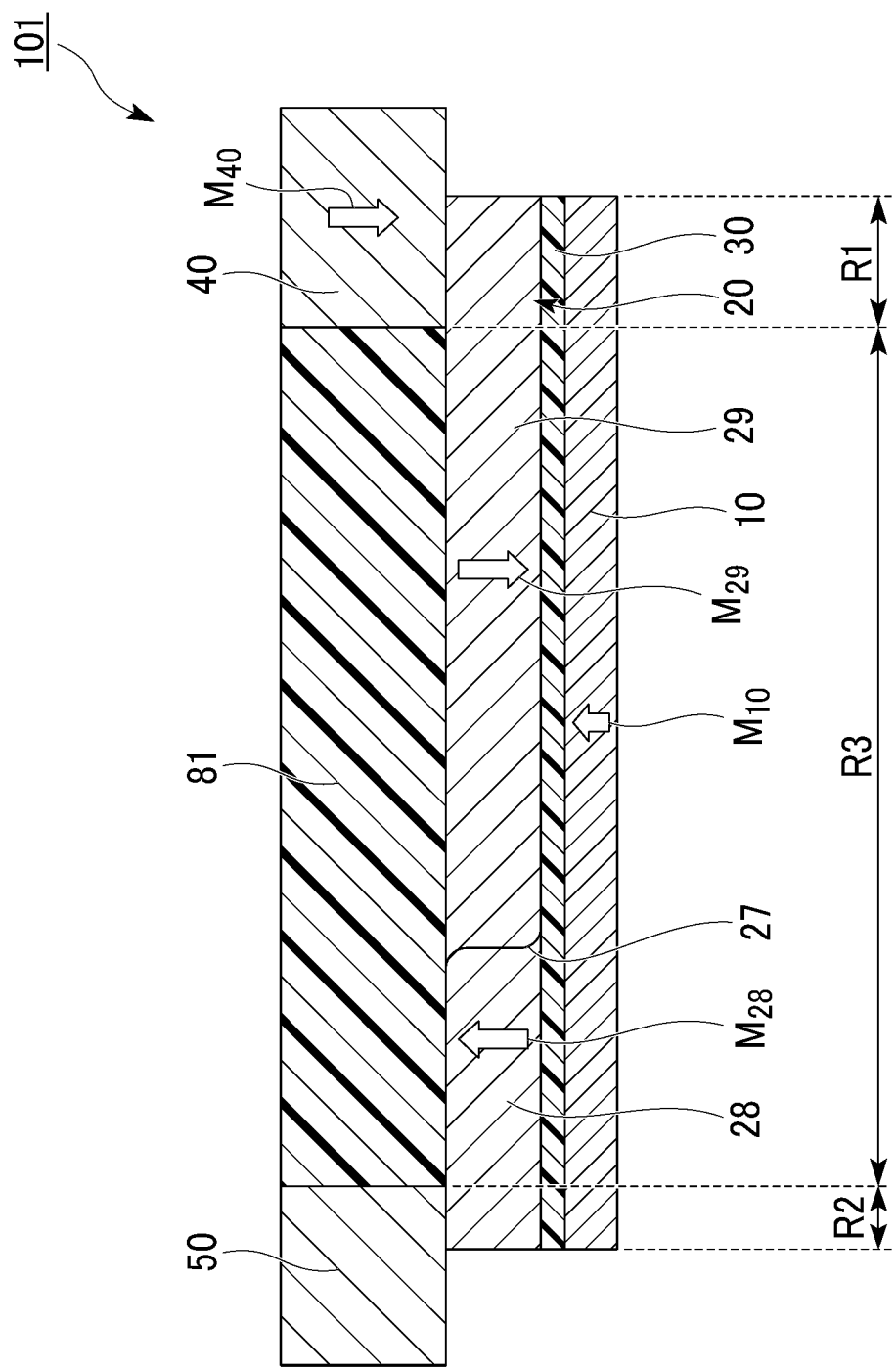
FIG. 11 is a schematic cross-sectional view of a storage element of the semiconductor device according to the second embodiment.

FIG. 11 is a schematic cross-sectional view of a storage element of the semiconductor device according to the second embodiment. A storage element 101 includes a first ferromagnetic layer 10, a magnetic recording layer 20, a nonmagnetic layer 30, a first electrode 40, and a second electrode 50. An insulating layer 81 is provided between the first electrode 40 and the second electrode 50.

The insulating layer 81 that is the same as the insulating layer 80 in the first embodiment is utilized. The insulating layer 81 is formed on a surface of the magnetic recording layer 20 opposite to a surface on the nonmagnetic layer 30 side. The insulating layer 81 covers a third region R3 of the magnetic recording layer 20. The insulating layer 81 functions as a cap layer. The cap layer is a layer configured to increase orientation of the magnetization of the magnetic recording layer 20 and protect the magnetic recording layer 20. When the cap layer is made of an insulator, a current for driving the magnetic domain wall 27 is prevented from being diverted toward the insulating layer 81 side.

The storage element 101 having a bottom pin structure is prepared through the following procedure. First, a first transistor Tr1, a second transistor Tr2, a third transistor Tr3, a first wiring Cm, a second wiring Wp, and a third wiring Rp are formed above the substrate 60 via the insulating layer 80. Furthermore, the first ferromagnetic layer 10, the nonmagnetic layer 30, and the magnetic recording layer 20 are sequentially laminated on one surface of the insulating layer 80 and each of the layers is processed to have a predetermined shape. In addition, the surroundings of the first ferromagnetic layer 10, the nonmagnetic layer 30, and the magnetic recording layer 20 are further covered with the insulating layer 80. Surfaces of the magnetic recording layer 20 and the insulating layer 80 are planarized and then the first electrode 40 and the second electrode 50 are formed. Moreover, the semiconductor device 201 is obtained by burying an insulating layer 81 between the first electrode 40 and the second electrode 50.

Also in the storage element 101 according to the second embodiment, an area of a first section R1a in a first region R1 is larger than an area of a second section R2a in a second region R2. Thus, a range (a dynamic range) of a resistance change of the storage element 101 is wide.

For the storage element 101 according to the second embodiment, it is possible to select the same modification as in the storage element 100 according to the first embodiment.

(Six Modification)

Figure 12:
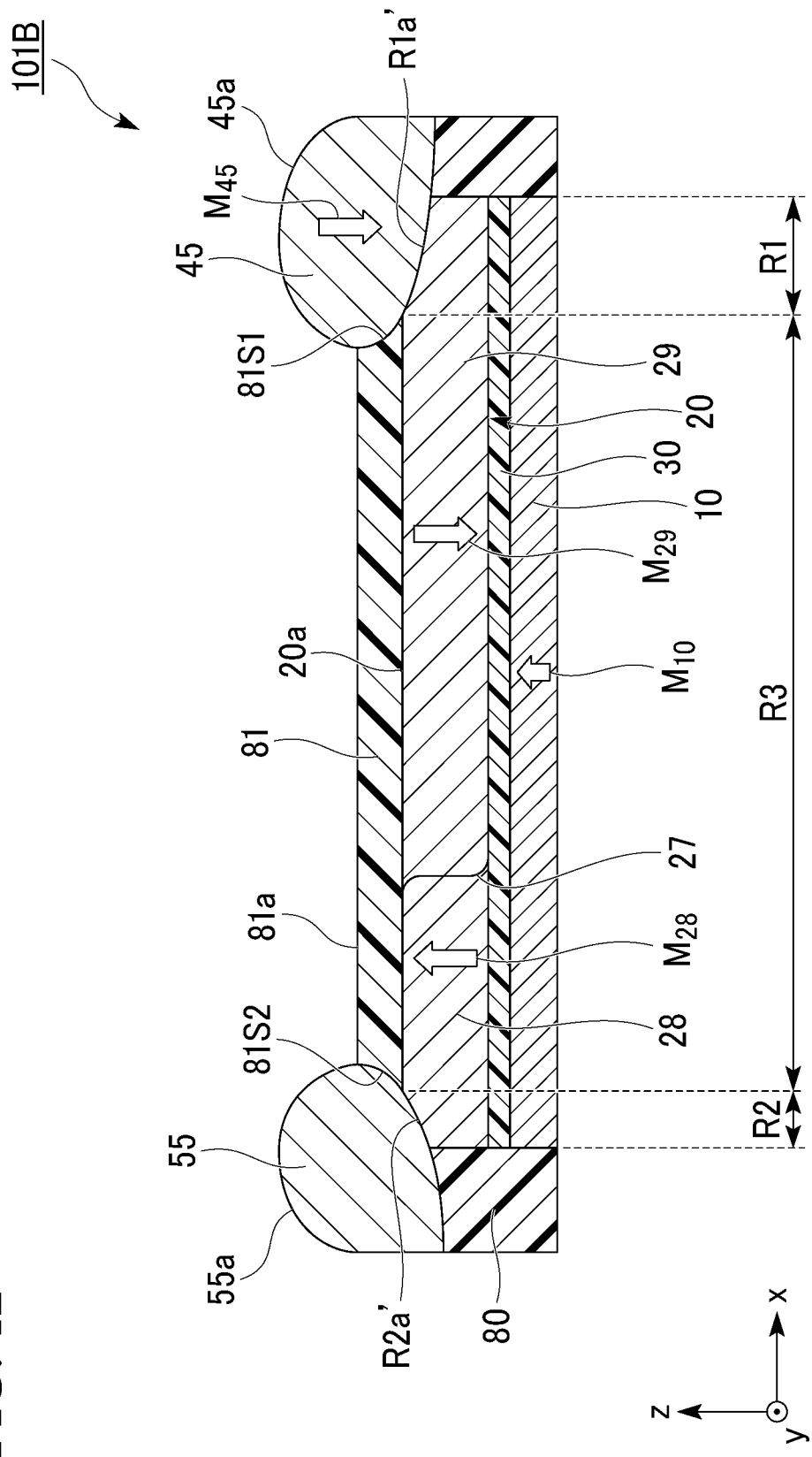
FIG. 12 is a schematic cross-sectional view of a sixth modification of the storage element of the semiconductor device according to the second embodiment.

FIG. 12 is a schematic cross-sectional view of a sixth modification of the storage element according to the second embodiment. A storage element 101B illustrated in FIG. 12 and the storage element 101 according to the second embodiment illustrated in FIG. 11 in view of shapes of a first electrode 45 and a second electrode 55, shapes of a first section R1a' and a second section R2a' in the magnetic recording layer 20, and a relationship between the first electrode 45 and the second electrode 55 and the insulating layer 81 differs. Other constitutions illustrated in FIG. 12 are the same as those of the storage element 101 according to the second embodiment illustrated in FIG. 11, constituent elements in FIG. 12 that are the same as those of FIG. 11 will be denoted with the same reference numerals as in FIG. 11, and a description thereof will be omitted.

A first region R1 in the magnetic recording layer 20 has the first section R1a'. The first section R1a' corresponds to a surface of the magnetic recording layer 20 in the first region R1 facing the first electrode 45. The first section R1a' corresponds to, for example, a surface of the magnetic recording layer 20 in the first region R1 in contact with the first electrode 45. A second region R2 in the magnetic recording layer 20 has the second section R2a'. The second section R2a' corresponds to a surface of the magnetic recording layer 20 in the first region R2 facing the second electrode 55. The second section R2a' corresponds to, for example, a surface of the magnetic recording layer 20 in the second region R2 in contact with the second electrode 55. An area of the first section R1a' is larger than an area of the second section R2a'. The first section R1a' and the second section R2a' are inclined in the x direction with respect to the z direction. The first surfaces 20a, the first section R1a', and the second section R2a' which are surfaces of the magnetic recording layer 20 in the z direction are discontinuous. The first section R1a' and the second section R2a' are formed by milling a part of the magnetic recording layer 20 when a part of the insulating layer 81 is removed.

Also, the first section R1a' and the second section R2a' in the magnetic recording layer 20 serve as pinning sites. When magnetizations of the first region R1 and the second region R2 are fixed more strongly (the magnetizations thereof do not easily reverse), the magnetic domain wall 27 does not easily enter the first region R1 and the second region R2.

The first electrode 45 and the second electrode 55 have circular arc convex surfaces 45a and 55a on a virtual cross-section passing through a center of the magnetic recording layer 20 in the y direction and cut along the xz plane. Surfaces of the first electrode 45 and the second electrode 55 may be formed in a circular arc shape due to surface tension in some cases.

A surface 81a of the insulating layer 81 is located further in the −z direction than at least a part of the surfaces 45a and 55a of the first electrode 45 and the second electrode 55. Two lateral surfaces 81S1 and 81S2 of the insulating layer 81 in the x direction are inclined in the x direction with respect to the z direction. The lateral surfaces 81S1 and 81S2 are formed through milling.

Also in the storage element 101B according to the sixth modification, an area of the first section R1a' in the first region R1 is larger than an area of the second section R2a' in the second region R2. Thus, a range (a dynamic range) of a resistance change of the storage element 101B is wide.

Third Embodiment

Figure 13:
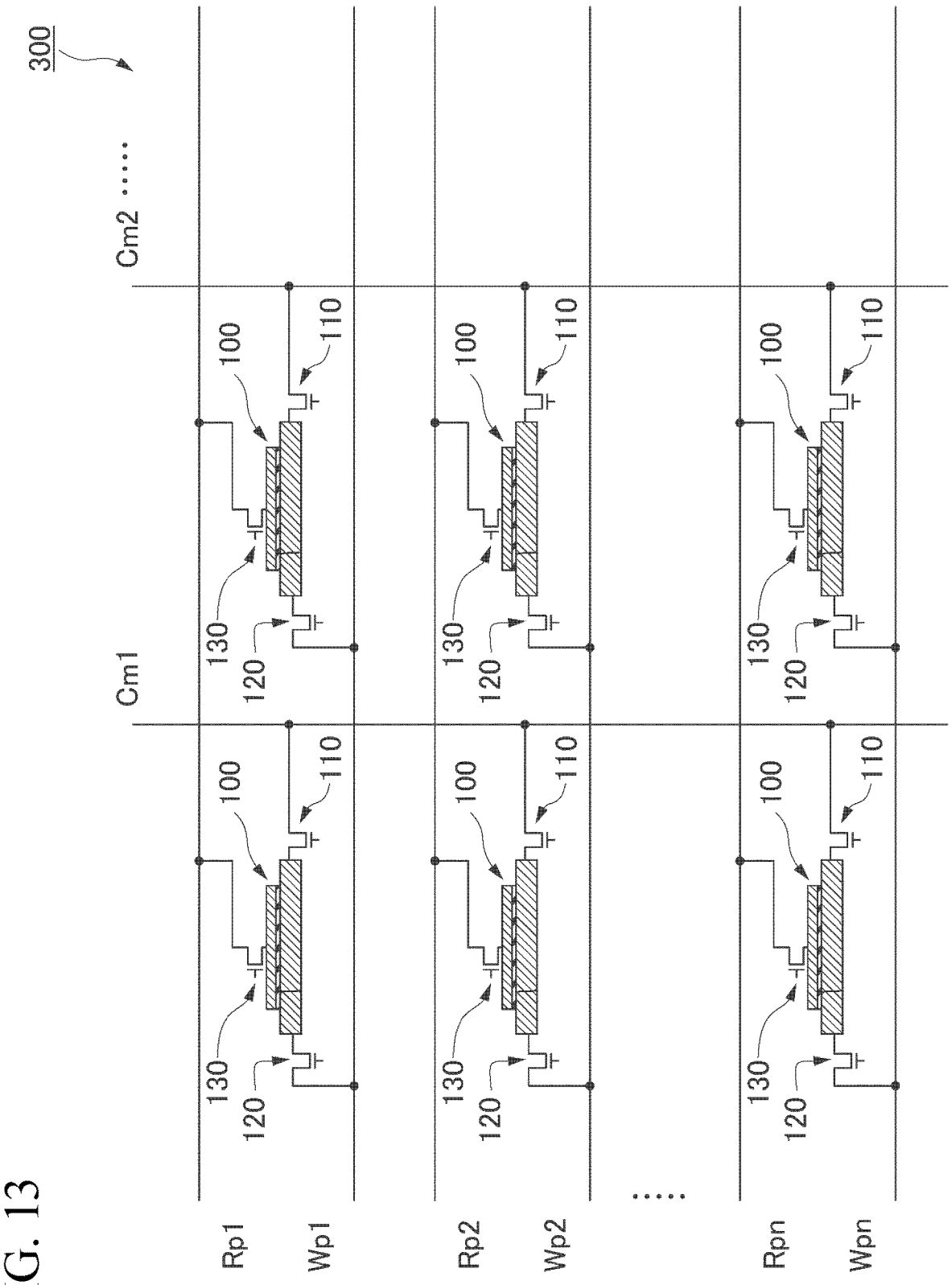
FIG. 13 is a constitution diagram of a magnetic recording array according to a third embodiment.

FIG. 13 is a constitution diagram of a magnetic recording array according to a third embodiment. A magnetic recording array 300 includes storage elements 100, first wirings Cm1 to Cmn, second wirings Wp1 to Wpn, third wirings Rp1 to Rpn, first switching elements 110, second switching elements 120, and third switching elements 130. The first wiring Cm illustrated in FIG. 1 is one of the first wirings Cm1 to Cmn illustrated in FIG. 12. The second wiring Wp illustrated in FIG. 1 is one of the second wirings Wp1 to Wpn illustrated in FIG. 12. The third wiring Rp illustrated in FIG. 1 is one of the third wirings Rp1 to Rpn illustrated in FIG. 12. One of the first switching elements 110 is, for example, the third transistor Tr3 illustrated in FIG. 1. One of the second switching elements 120 is, for example, the first transistor Tr1 illustrated in FIG. 1. One of the third switching elements 130 is, for example, the second transistor Tr2 illustrated in FIG. 1. Furthermore, these storage elements 100 are not limited to the storage elements 100 illustrated in FIG. 1 and may have a constitution of another modification or another embodiment.

<First Wiring, Second Wiring, and Third Wiring>

The first wirings Cm1 to Cmn are common wirings. Each of the common wirings is a wiring used both at the time of writing data and at the time of reading data. The first wirings Cm1 to Cmn are electrically connected to a reference potential. For example, when the first wirings Cm1 to Cmn are grounded, the reference potential serves as a ground. Furthermore, the first wirings Cm1 to Cmn are connected to at least one storage element 100 among a plurality of storage elements 100. The first wirings Cm1 to Cmn may be provided in each of the plurality of storage elements 100 or may be provided over the plurality of storage elements 100.

The second wirings Wp1 to Wpn are write wirings. The second wirings Wp1 to Wpn are electrically connected to at least two or more storage elements 100 among the plurality of storage elements 100. The second wirings Wp1 to Wpn are connected to a power supply at the time of using the magnetic recording array 300.

The third wirings Rp1 to Rpn are read wirings. The third wirings Rp1 to Rpn are electrically connected to at least one or more storage elements 100 among the plurality of storage elements 100. The third wirings Rp1 to Rpn are connected to the power supply at the time of using the magnetic recording array 300.

<First Switching Element, Second Switching Element, and Third Switching Element>

The first switching elements 110 are connected between the storage elements 100 and the first wirings Cm1 to Cmn. The second switching elements 120 are connected between the storage elements 100 and the second wirings Wp1 to Wpn. The third switching elements 130 are connected between the storage elements 100 and the third wirings Rp1 to Rpn.

If the first switching element 110 and the second switching elements 120 are turned on, a write current flows between the first wirings Cm1 to Cmn and the second wirings Wp1 to Wpn connected to predetermined storage elements 100. If the first switching elements 110 and the third switching elements 130 are turned on, a read current flows between the first wirings Cm1 to Cmn and the third wirings Rp1 to Rpn connected to predetermined storage elements 100.

The first switching elements 110, the second switching elements 120, and the third switching elements 130 are elements configured to control a flow of a current. For example, as the first switching elements 110, the second switching elements 120, and the third switching elements 130, elements such as transistors and ovonic threshold switches (OTSs) in which a phase change of a crystal layer is used, elements such as a metal-insulator transition (MIT) switch in which a change in band structure is used, elements such as Zener diodes and avalanche diodes in which a breakdown voltage is used, elements in which conductivity changes with a change in atomic position, and the like can be utilized.

One of the second switching elements 120 and one the third switching elements 130 may be shared for the storage elements 100 connected to one of second wiring Wp1 to Wpn or one of third wiring Rp1 to Rpn. For example, one second switching element 120 may be provided on an upstream side of any of the second wirings Wpn. Furthermore, for example, one third switching element 130 may be provided on an upstream side of any of the third wirings Rpn. It is possible to select a specific storage element 100 by switching turning-on/-off of a first switching element 110 connected to each of the storage elements 100.

The magnetic recording array 300 includes the plurality of storage elements 100 integrated therein. A range (a dynamic range) of a resistance change of each of the storage elements 100 is wide. Therefore, an influence of noise on data recorded by each of the storage elements 100 is minimized and reliability of data in the magnetic recording array 300 is further improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 10, 11 First ferromagnetic layer
20, 21 Magnetic recording layer
27 Magnetic domain wall
28 First magnetic domain
29 Second magnetic domain
30, 31 Nonmagnetic layer
40, 41, 43, 44, 45 First electrode
50, 51, 52, 53, 54, 55 Second electrode
60 Substrate
70 Interlayer insulating film
80 Insulating layer
100, 100A, 100B, 100C, 100D, 100E, 101 Semiconductor device
110 First switching element
120 Second switching element
130 Third switching element
200 Magnetic recording array
20a, 40a, 50a, 60a First surface
20b Second surface
11S1, 21S1, 31S1, 43S1, 44S1, 53S1, 54S1 First lateral surface
11S2, 21S2, 31S2, 43S2, 44S2, 53S2, 54S2 Second lateral surface
43p1, 44p1, 53p1, 54p1 First inclined section
43p2, 53p2 Second section
44p2, 54p2 Second inclined section
R1 First region
R1a, R1a' First section
R2a, R2a' Second section
R2 Second region
R3 Third region
$M_{10}$, $M_{11}$, $M_{28}$, $M_{29}$, $M_{40}$, $M_{43}$, $M_{44}$, $M_{52}$ Magnetization
Cm1 to Cmn First wiring
Wp1 to Wpn Second wiring
Rp1 to Rpn Third wiring

What is claimed is:

1. A magnetic domain wall movement element comprising:
   a first ferromagnetic layer;
   a magnetic recording layer located in a first direction with respect to the first ferromagnetic layer and extending in a second direction;
   a nonmagnetic layer located between the first ferromagnetic layer and the magnetic recording layer; and
   a first electrode and a second electrode which are located on a side of the magnetic recording layer opposite to the nonmagnetic layer, and each of the first electrode and the second electrode being configured to overlap with a part of the magnetic recording layer in the first direction,
wherein the first electrode includes a magnetic material whose magnetization is oriented in a direction different from a direction of magnetization of the first ferromagnetic layer,
the magnetic recording layer includes: a first region which overlaps with the first electrode and the first ferromagnetic layer in the first direction; a second region which overlaps with the second electrode and the first ferromagnetic layer in the first direction; and a third region which is located between the first region and the second region,
an area of a first section in the first region facing the first electrode is larger than an area of a second section in the second region facing the second electrode, and
the first ferromagnetic layer overlaps with a part of the first electrode and a part of the second electrode in the first direction.

2. The magnetic domain wall movement element according to claim 1, wherein the second electrode includes a magnetic material whose magnetization is oriented in the same direction as the direction of magnetization of the first ferromagnetic layer.

3. The magnetic domain wall movement element according to claim 1, further comprising a substrate,
wherein the first ferromagnetic layer is located closer to the substrate than the magnetic recording layer.

4. The magnetic domain wall movement element according to claim 3, further comprising an insulating layer configured to cover the third region of the magnetic recording layer.

5. The magnetic domain wall movement element according to claim 1, further comprising a substrate,
wherein the first ferromagnetic layer is located farther from the substrate than the magnetic recording layer.

6. The magnetic domain wall movement element according to claim 5, wherein a lateral surface of the magnetic recording layer in the second direction is inclined with respect to the first direction.

7. The magnetic domain wall movement element according to claim 5, wherein the first electrode has a first inclined section inclined with respect to the first direction.

8. The magnetic domain wall movement element according to claim 5, wherein on a virtual cross-section passing through a center of the magnetic recording layer in a third direction orthogonal to the first direction and the second direction and extending in the first direction and the second direction,
the first electrode has a first lateral surface and a second lateral surface located closer to the second electrode than the first lateral surface, and
the first lateral surface has a portion having an inclination angle larger than an inclination angle with respect to the first direction of the second lateral surface.

9. The magnetic domain wall movement element according to claim 5, wherein on a virtual cross-section passing through a center of the magnetic recording layer in the third direction orthogonal to the first direction and the second direction and extending in the first direction and the second direction,
the first electrode has a first lateral surface and a second lateral surface located closer to the second electrode than the first lateral surface, and the first lateral surface has a portion in which an inclination thereof with respect to the first direction changes discontinuously.

10. A magnetic recording array comprising a plurality of the magnetic domain wall movement elements according to claim 1.

11. The magnetic domain wall movement element according to claim 2, further comprising a substrate,
wherein the first ferromagnetic layer is located closer to the substrate than the magnetic recording layer.

12. The magnetic domain wall movement element according to claim 2, further comprising a substrate,
wherein the first ferromagnetic layer is located farther from the substrate than the magnetic recording layer.

13. The magnetic domain wall movement element according to claim 6, wherein the first electrode has a first inclined section inclined with respect to the first direction.

14. The magnetic domain wall movement element according to claim 6, wherein on a virtual cross-section passing through a center of the magnetic recording layer in a third direction orthogonal to the first direction and the second direction and extending in the first direction and the second direction,
the first electrode has a first lateral surface and a second lateral surface located closer to the second electrode than the first lateral surface, and
the first lateral surface has a portion having an inclination angle larger than an inclination angle with respect to the first direction of the second lateral surface.

15. The magnetic domain wall movement element according to claim 7, wherein on a virtual cross-section passing through a center of the magnetic recording layer in a third direction orthogonal to the first direction and the second direction and extending in the first direction and the second direction,
the first electrode has a first lateral surface and a second lateral surface located closer to the second electrode than the first lateral surface, and
the first lateral surface has a portion having an inclination angle larger than an inclination angle with respect to the first direction of the second lateral surface.

16. The magnetic domain wall movement element according to claim 6, wherein on a virtual cross-section passing through a center of the magnetic recording layer in the third direction orthogonal to the first direction and the second direction and extending in the first direction and the second direction,
the first electrode has a first lateral surface and a second lateral surface located closer to the second electrode than the first lateral surface, and
the first lateral surface has a portion in which an inclination thereof with respect to the first direction changes discontinuously.

17. The magnetic domain wall movement element according to claim 7, wherein on a virtual cross-section passing through a center of the magnetic recording layer in the third direction orthogonal to the first direction and the second direction and extending in the first direction and the second direction,
the first electrode has a first lateral surface and a second lateral surface located closer to the second electrode than the first lateral surface, and
the first lateral surface has a portion in which an inclination thereof with respect to the first direction changes discontinuously.

18. The magnetic domain wall movement element according to claim 8, wherein on a virtual cross-section passing through a center of the magnetic recording layer in the third direction orthogonal to the first direction and the second direction and extending in the first direction and the second direction, the first electrode has a first lateral surface and a second lateral surface located closer to the second electrode than the first lateral surface, and the first lateral surface has a portion in which an inclination thereof with respect to the first direction changes discontinuously.

19. A magnetic recording array comprising a plurality of the magnetic domain wall movement elements according to claim 2.

20. A magnetic recording array comprising a plurality of the magnetic domain wall movement elements according to claim 3.

* * * * *